(12) United States Patent
Saida et al.

(10) Patent No.: US 9,818,464 B2
(45) Date of Patent: Nov. 14, 2017

(54) MAGNETIC MEMORY ELEMENT AND MEMORY DEVICE

(71) Applicant: Kabushiki Kaisha Toshiba, Minato-ku (JP)

(72) Inventors: Daisuke Saida, Shinagawa (JP); Minoru Amano, Sagamihara (JP); Jyunichi Ozeki, Yokosuka (JP); Naoharu Shimomura, Meguro (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/263,952

(22) Filed: Sep. 13, 2016

(65) Prior Publication Data

US 2016/0379698 A1  Dec. 29, 2016

Related U.S. Application Data

(63) Continuation of application No. PCT/JP2014/082737, filed on Dec. 10, 2014.

(30) Foreign Application Priority Data

Mar. 13, 2014 (JP) .................................. 2014-050798

(51) Int. Cl.
    *G11C 11/00* (2006.01)
    *G11C 11/16* (2006.01)
    (Continued)

(52) U.S. Cl.
    CPC ........ *G11C 11/161* (2013.01); *G11C 11/1673* (2013.01); *G11C 11/1675* (2013.01);
    (Continued)

(58) Field of Classification Search
    CPC .............. G11C 11/161; G11C 11/1675; G11C 11/1673; G11C 11/5628; G11C 11/5642;
    (Continued)

(56) References Cited

U.S. PATENT DOCUMENTS 9,123,884 B2    9/2015  Luo et al.
2009/0244792 A1  10/2009  Nakayama et al.
(Continued)

FOREIGN PATENT DOCUMENTS

JP    2009-231753    10/2009
JP    2012-64863      3/2012
(Continued)

OTHER PUBLICATIONS

International Search Report issued Feb. 24, 2015 in PCT/JP2014/082737, filed on Dec. 10, 2014 (with English Translation).

(Continued)

*Primary Examiner* — Thong Q Le
(74) *Attorney, Agent, or Firm* — Oblon, McClelland, Maier & Neustadt, L.L.P.

(57) ABSTRACT

According to one embodiment, a magnetic memory element includes a stacked structure. The stacked structure includes a first and a second stacked member. The first stacked member includes a first and second ferromagnetic layer. A magnetic resonance frequency of the second ferromagnetic layer is a first frequency. A direction of a magnetization of the second ferromagnetic layer is settable to a direction of a first current when a magnetic field of the first frequency is applied to the first stacked member and the first current flows in the first stacked member. The direction of the magnetization of the second ferromagnetic layer does not change when the second current smaller than the first current flows in the first stacked member. The second stacked member includes a third ferromagnetic layer. A magnetization of the third ferromagnetic layer can generate a magnetic field of the first frequency by the second current.

13 Claims, 13 Drawing Sheets

(51) Int. Cl.
*H01L 43/08* (2006.01)
*H01L 43/10* (2006.01)
*H01L 27/22* (2006.01)
*H01L 43/02* (2006.01)
*G11C 11/56* (2006.01)
*H01F 10/193* (2006.01)
*H01F 10/32* (2006.01)

(52) U.S. Cl.
CPC ...... *G11C 11/5607* (2013.01); *H01F 10/3286* (2013.01); *H01L 27/228* (2013.01); *H01L 43/02* (2013.01); *H01L 43/08* (2013.01); *H01L 43/10* (2013.01); *H01F 10/1936* (2013.01); *H01F 10/3277* (2013.01); *H01F 10/3295* (2013.01)

(58) Field of Classification Search
CPC ... G11C 13/004; G11C 11/16; G11C 11/1693; G11C 16/0483; G11C 16/10; G11C 11/1697; G11C 13/0004; G11C 13/0007
USPC ....... 257/421, 4; 365/158, 145, 148, 185.22, 365/51, 66
See application file for complete search history.

(56) References Cited

U.S. PATENT DOCUMENTS

| | | | |
|---|---|---|---|
| 2009/0296462 A1* | 12/2009 | Kent | ........................ G11C 11/16 365/171 |
| 2012/0068281 A1 | 3/2012 | Saida et al. | |
| 2012/0140354 A1 | 6/2012 | Takeo et al. | |
| 2012/0241827 A1* | 9/2012 | Daibou | ................. H01L 27/228 257/295 |
| 2012/0243308 A1 | 9/2012 | Saida et al. | |
| 2013/0069185 A1 | 3/2013 | Saida et al. | |
| 2013/0070522 A1 | 3/2013 | Saida et al. | |
| 2013/0070523 A1 | 3/2013 | Saida et al. | |
| 2013/0181305 A1* | 7/2013 | Nakayama | .............. G11C 11/16 257/421 |
| 2013/0249024 A1 | 9/2013 | Saida et al. | |
| 2014/0085968 A1 | 3/2014 | Saida et al. | |
| 2014/0269037 A1 | 9/2014 | Saida et al. | |

FOREIGN PATENT DOCUMENTS

| | | |
|---|---|---|
| JP | 2012-64904 | 3/2012 |
| JP | 2012-069958 | 4/2012 |
| JP | 2012-119629 | 6/2012 |
| JP | 2012-204680 | 10/2012 |
| JP | 2012-204688 | 10/2012 |
| JP | 2013-69819 | 4/2013 |
| JP | 2013-69820 | 4/2013 |
| JP | 2013-69821 | 4/2013 |
| JP | 2013-197317 | 9/2013 |
| JP | 2014-67469 | 4/2014 |
| JP | 2014-179381 | 9/2014 |
| WO | WO 2011/096312 A1 | 8/2011 |

OTHER PUBLICATIONS

Written Opinion Issued Feb. 24, 2015 in PCT/JP2014/082737, filed on Dec. 10, 2014.

F. D. Czeschka, et al., "Scaling Behavior of the Spin Pumping Effect in Ferromagnet-Platinum Bilayers" Physical Review Letters, 2011, pp. 046601-1-046601-4.

Written Opinion of the International Searching Authority (translation of form PCT/ISA/237), International application No. PCT/JP20141082737, dated: Feb. 24, 2015.

* cited by examiner

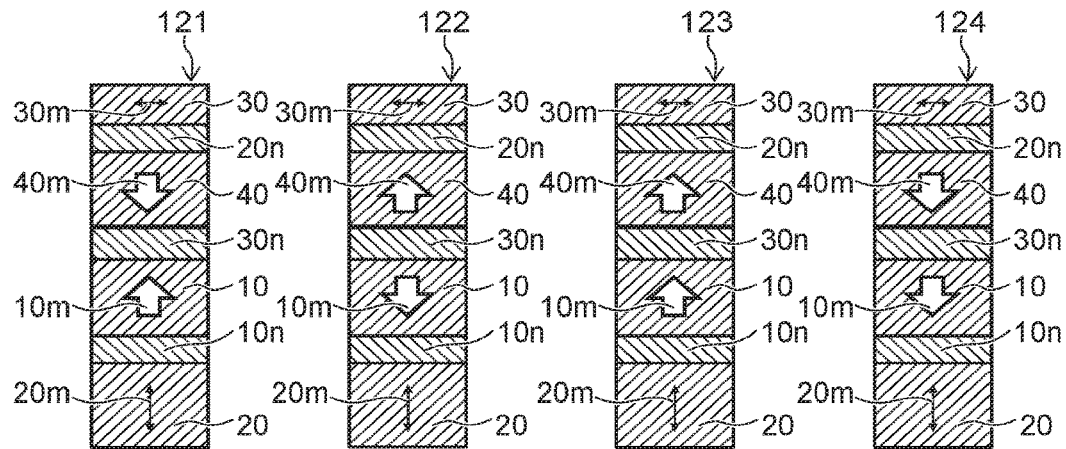
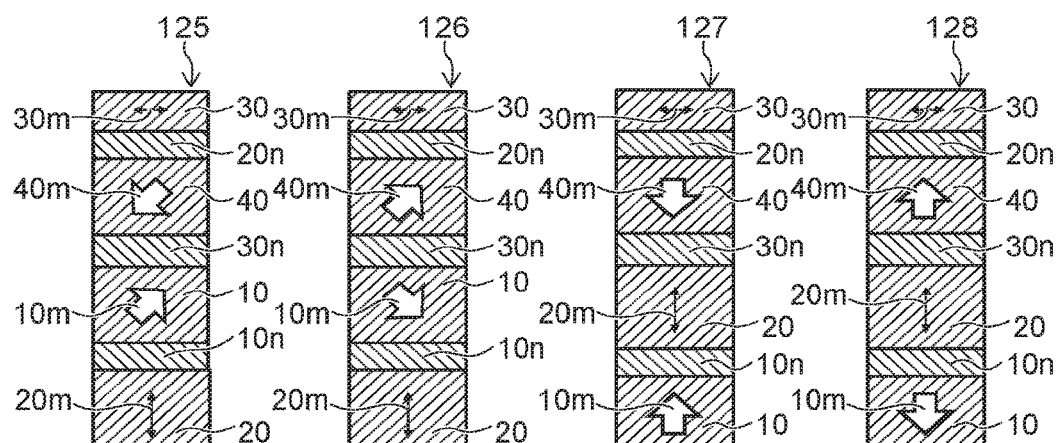
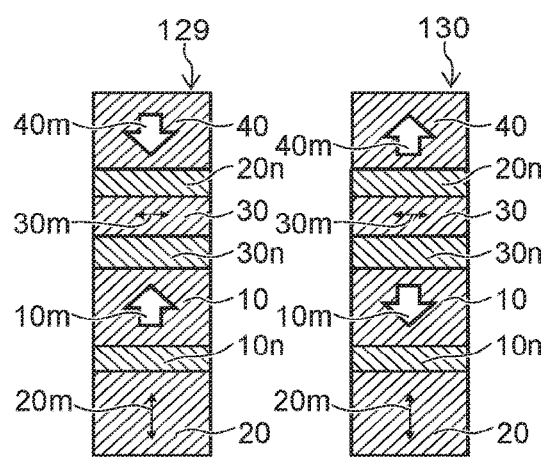

MAGNETIC MEMORY ELEMENT AND MEMORY DEVICE

CROSS-REFERENCE TO RELATED APPLICATIONS

This is a continuation application of International Application PCT/JP2014/082737, filed on Dec. 10, 2014. This application also claims priority to Japanese Application No. 2014-050798, filed on Mar. 13, 2014. The entire contents of each are incorporated herein by reference.

FIELD

Embodiments described herein relate generally to a magnetic memory element and a memory device.

BACKGROUND

There is a configuration of magnetic random access memory (MRAM) in which a magnetic tunnel junction (MTJ) element having a tunneling magnetoresistive (TMR) effect is included in a data memory unit. Such a configuration is drawing attention as a high-speed/large-capacity memory device. It is desirable to increase the reliability of such a magnetic memory element and such a memory device.

BRIEF DESCRIPTION OF THE DRAWINGS

FIG. 8A to FIG. 8J are schematic cross-sectional views showing magnetic memory elements according to the first embodiment;

DETAILED DESCRIPTION

Figure 1:
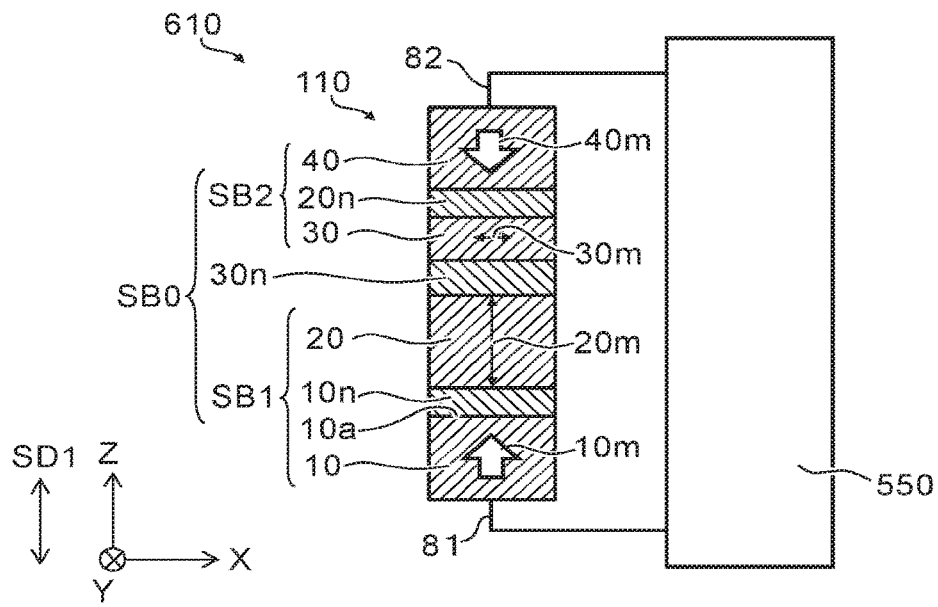
FIG. 1 is a schematic cross-sectional view showing a memory device according to a first embodiment.

According to one embodiment, a magnetic memory element includes a stacked structure. The stacked structure includes a first stacked member and a second stacked member. The first stacked member includes a first ferromagnetic layer, a second ferromagnetic layer and a first nonmagnetic layer. The first nonmagnetic layer is provided between the first ferromagnetic layer and the second ferromagnetic layer. A magnetic resonance frequency of the second ferromagnetic layer is a first frequency. A direction of a magnetization of the second ferromagnetic layer is settable to a direction corresponding to an orientation of a first current when a magnetic field of the first frequency is applied to the first stacked member and the first current flows in the first stacked member along a first direction connecting the first ferromagnetic layer and the second ferromagnetic layer. The direction of the magnetization of the second ferromagnetic layer does not change to a direction corresponding to an orientation of a second current smaller than the first current when the second current flows in the first stacked member. The second stacked member is stacked with the first stacked member along the first direction. The second stacked member includes a third ferromagnetic layer. A magnetization of the third ferromagnetic layer is able to generate a magnetic field of the first frequency by the second current flowing in the second stacked member along the first direction. The direction of the magnetization of the second ferromagnetic layer is settable to a direction corresponding to an orientation of a current by causing the current to flow in the first stacked member and the second stacked member along the first direction to generate a magnetic field acting on the second ferromagnetic layer.

According to one embodiment, a magnetic memory element includes a stacked structure. The stacked structure includes a first stacked member, a second stacked member, and an intermediate interconnect. The first stacked member includes a first ferromagnetic layer, a second ferromagnetic layer, and a first nonmagnetic layer. The first nonmagnetic layer is provided between the first ferromagnetic layer and the second ferromagnetic layer. A magnetic resonance frequency of the second ferromagnetic layer is a first frequency. The second stacked member is stacked with the first stacked member along a first direction. The second stacked member includes a third ferromagnetic layer. The intermediate interconnect is provided between the first stacked member and the second stacked member. A magnetization of the third ferromagnetic layer is caused to generate a magnetic field by causing a current to flow in the second stacked member along the first direction. A direction of a magnetization of the second ferromagnetic layer is settable to a direction corresponding to an orientation of the current by the magnetic field. A current not flowing in the first stacked member when the current flows in the second stacked member, or a current flowing in the first stacked member being smaller than the current flowing in the second stacked member when the current flows in the second stacked member.

According to one embodiment, a magnetic memory element includes a stacked structure. The stacked structure includes a first stacked member and a second stacked member. The first stacked member includes a first ferromagnetic layer, a second ferromagnetic layer, and a first nonmagnetic layer. The first nonmagnetic layer is provided between the first ferromagnetic layer and the second ferromagnetic layer. The second stacked member is stacked with the first stacked member along a first direction. The second stacked member includes a third ferromagnetic layer. The third ferromagnetic layer includes at least one selected from a group consisting of $Co_2MnGa$, $Co_2MnAl$, $Ni_2MnIn$, $Ni_2MnGa$, $Ni_2MnSn$, $Pd_2MnSb$, $Pd_2MnSn$, $Cu_2MnAl$, $Cu_2MnSn$, $Cu_2MnIn$, $Rh_2MnGe$, and $Rh_2MnPb$. A direction of a magnetization of the second ferromagnetic layer is settable to a direction corresponding to an orientation of a current by causing the current to flow in the first stacked member and the second stacked member along the first direction to generate a magnetic field acting on the second ferromagnetic layer.

According to one embodiment, a magnetic memory element includes a stacked boy. The stacked structure includes a first stacked member and a second stacked member. The first stacked member includes a first ferromagnetic layer, a second ferromagnetic layer and a first nonmagnetic layer. The first nonmagnetic layer is provided between the first ferromagnetic layer and the second ferromagnetic layer. The second stacked member is stacked with the first stacked member along a first direction. The second stacked member includes a third ferromagnetic layer. The third ferromagnetic layer includes at least one selected from a group consisting of $Co_2FeSi$, $Co_2FeAl$, $Co_2FeGa$, $Co_2MnGe$, $Co_2MnSn$, and $Co_2MnSi$. A direction of a magnetization of the second ferromagnetic layer is settable to a direction corresponding to an orientation of a current by causing the current to flow in the first stacked member and the second stacked member along the first direction to generate a magnetic field acting on the second ferromagnetic layer.

According to one embodiment, a memory device includes a magnetic memory element and a controller electrically connected to the magnetic memory element. The magnetic memory element includes a stacked structure. The stacked structure includes a first stacked member and a second stacked member. The first stacked member includes a first ferromagnetic layer, a second ferromagnetic layer and a first nonmagnetic layer. The first nonmagnetic layer is provided between the first ferromagnetic layer and the second ferromagnetic layer. A magnetic resonance frequency of the second ferromagnetic layer is a first frequency. A direction of a magnetization of the second ferromagnetic layer is settable to a direction corresponding to an orientation of a first current when a magnetic field of the first frequency is applied to the first stacked member and the first current flows in the first stacked member along a first direction connecting the first ferromagnetic layer and the second ferromagnetic layer. The direction of the magnetization of the second ferromagnetic layer does not change to a direction corresponding to an orientation of a second current smaller than the first current when the second current flows in the first stacked member. The second stacked member is stacked with the first stacked member along the first direction. The second stacked member includes a third ferromagnetic layer. A magnetization of the third ferromagnetic layer is able to generate a magnetic field of the first frequency by the second current flowing in the second stacked member along the first direction. The direction of the magnetization of the second ferromagnetic layer is settable to a direction corresponding to an orientation of a current by causing the current to flow in the first stacked member and the second stacked member along the first direction to generate a magnetic field acting on the second ferromagnetic layer.

Embodiments will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

First Embodiment

FIG. 1 is a schematic cross-sectional view illustrating a memory device according to a first embodiment.

As shown in FIG. 1, the memory device 610 according to the embodiment includes a magnetic memory element 110 and a controller 550. The memory device 610 is a nonvolatile memory device, for example.

The magnetic memory element 110 includes a stacked structure SB0. The stacked structure SB0 includes a first stacked member SB1 and a second stacked member SB2.

The controller 550 is electrically connected to the magnetic memory element 110. The controller 550 controls the operations of the magnetic memory element 110 by applying a voltage and supplying a current to the magnetic memory element 110.

The first stacked member SB1 includes a first ferromagnetic layer 10, a second ferromagnetic layer 20, and a first nonmagnetic layer 10n.

The first ferromagnetic layer 10 has a major surface 10a. The direction of a magnetization 10m of the first ferromagnetic layer 10 is substantially fixed. For example, the direction of the magnetization 10m of the first ferromagnetic layer 10 has a component perpendicular to the major surface 10a. The direction of the magnetization 10m of the first ferromagnetic layer 10 is non-parallel to the major surface 10a.

The second ferromagnetic layer 20 is stacked with the first ferromagnetic layer 10. The direction of a magnetization 20m of the second ferromagnetic layer 20 is changeable. A stacking direction SD1 is, for example, perpendicular to the major surface 10a. The second ferromagnetic layer 20 includes, for example, an alloy.

The first nonmagnetic layer 10n is provided between the first ferromagnetic layer 10 and the second ferromagnetic layer 20. For example, the first nonmagnetic layer 10n contacts the first ferromagnetic layer 10 and the second ferromagnetic layer 20. The first ferromagnetic layer 10, the second ferromagnetic layer 20, and the first nonmagnetic layer 10n are stacked in the stacking direction SD1.

In the specification of the application, the state of being stacked includes not only the state of being overlaid in direct contact but also the case of being overlaid with another component inserted therebetween.

A direction parallel to the stacking direction SD1 of the first stacked member SB1 is taken as a Z-axis direction. One axis perpendicular to the Z-axis is taken as an X-axis. An axis perpendicular to the X-axis and the Z-axis is taken as a Y-axis. The film surfaces of the layers included in the stacked structure SB0 are parallel to the X-Y plane. For example, the major surface 10a is parallel to the X-Y plane.

The second stacked member SB2 is stacked with the first stacked member SB1 in the stacking direction SD1. The second stacked member SB2 includes a third ferromagnetic layer 30. The third ferromagnetic layer 30 is stacked with the first stacked member SB1 in the stacking direction SD1. The direction of the magnetization of the third ferromagnetic layer 30 is changeable. The width (the length in a direction perpendicular to the stacking direction SD1) of the third ferromagnetic layer 30 is, for example, 35 nanometers (nm) or less. For example, in the case where the configuration of the third ferromagnetic layer 30 when projected onto the X-Y plane is a circle, the diameter of the circle is 35 nm or less. For example, the maximum length in the in-plane direction (a direction perpendicular to the stacking direction SD1) of the third ferromagnetic layer 30 is 35 nm or less. The thickness (the length in the stacking direction SD1) of the third ferromagnetic layer 30 is, for example, not less than 0.5 nm and not more than 3.5 nm.

In the example, the second stacked member SB2 further includes a fourth ferromagnetic layer 40 and a second nonmagnetic layer 20n. The fourth ferromagnetic layer 40 is stacked with the third ferromagnetic layer 30 in the stacking direction SD1. The direction of the magnetization of the fourth ferromagnetic layer 40 is substantially fixed. The second nonmagnetic layer 20n is provided between the third ferromagnetic layer 30 and the fourth ferromagnetic layer 40. For example, the second nonmagnetic layer 20n contacts the third ferromagnetic layer 30 and the fourth ferromagnetic layer 40.

In the example, the stacked structure SB0 further includes a third nonmagnetic layer 30n. The third nonmagnetic layer 30n is provided between the first stacked member SB1 and the second stacked member SB2. In the example, the first ferromagnetic layer 10, the first nonmagnetic layer 10n, the second ferromagnetic layer 20, the third nonmagnetic layer 30n, the third ferromagnetic layer 30, the second nonmagnetic layer 20n, and the fourth ferromagnetic layer 40 are stacked in this order. The third nonmagnetic layer 30n is, for example, a spin quenching layer that quenches the spin polarization of the electrons that flow. For example, the third nonmagnetic layer 30n contacts the first stacked member SB1 and the second stacked member SB2. In the example, the third nonmagnetic layer 30n contacts the second ferromagnetic layer 20 and the third ferromagnetic layer 30.

In the example, the magnetic memory element 110 further includes a first conductive layer 81 and a second conductive layer 82. The first stacked member SB1 is disposed between the first conductive layer 81 and the second conductive layer 82. The second stacked member SB2 is disposed between the first stacked member SB1 and the second conductive layer 82. The first conductive layer 81 is electrically connected to the first stacked member SB1. In the example, the first conductive layer 81 is electrically connected to the first ferromagnetic layer 10. The second conductive layer 82 is electrically connected to the second stacked member SB2. In the example, the second conductive layer 82 is electrically connected to the fourth ferromagnetic layer 40.

The first conductive layer 81 and the second conductive layer 82 are electrically connected to the controller 550. The magnetic memory element 110 is connected directly or indirectly to the controller 550 via the first conductive layer 81 and the second conductive layer 82. The first conductive layer 81 and the second conductive layer 82 may be considered to be separate from the magnetic memory element 110. For example, the memory device 610 further includes a first interconnect 91 and a second interconnect 92 (referring to FIG. 18). For example, the first interconnect 91 is electrically connected to the first conductive layer 81. For example, the second interconnect 92 is electrically connected to the second conductive layer 82. For example, the controller 550 is electrically connected to the magnetic memory element 110 via the first interconnect 91 and the second interconnect 92.

According to the memory device 610 according to the embodiment, a memory device in which misoperations are suppressed can be provided. For example, the magnetization reversal of the second ferromagnetic layer 20 can be assisted when programming in two directions even in the case where the width of the magnetic memory element 110 is 35 nm or less. Thereby, for example, misoperations when programming are suppressed. Also, the magnitude of the current (the programming current) when programming can be reduced.

In the magnetic memory element 110, the magnetization of the second ferromagnetic layer 20 and the magnetization of the third ferromagnetic layer 30 have magnetostatic coupling. Thereby, for example, the magnitude of the current when programming can be reduced.

An example of the configuration and operations of the magnetic memory element 110 will now be described. The description recited below is applicable not only to the magnetic memory element 110 but also to other magnetic memory elements according to the embodiment described below.

In the magnetic memory element 110, a current (a programming current) is caused to flow in the first stacked member SB1 and the second stacked member SB2 in the stacking direction SD1 to cause spin-polarized electrons to act on the second ferromagnetic layer 20. In the magnetic memory element 110, the magnetization of the third ferromagnetic layer 30 is caused to precess to generate a rotating magnetic field that acts on the second ferromagnetic layer 20. Thereby, the direction of the magnetization 20m of the second ferromagnetic layer 20 is determined to be a direction corresponding to the orientation of the current.

For example, the first ferromagnetic layer 10 functions as a first fixed magnetic layer. In the first ferromagnetic layer 10, for example, the direction of the magnetization 10m is fixed in a direction substantially perpendicular to the film surface. In other words, the direction of the magnetization 10m is fixed in a first direction that has a component in the stacking direction SD1 connecting the first ferromagnetic layer 10 and the second ferromagnetic layer 20. The direction of the magnetization 10m of the first ferromagnetic layer 10 is, for example, substantially parallel to the stacking direction SD1.

In the second ferromagnetic layer 20, for example, the easy magnetization axis is a direction substantially perpendicular to the film surface. For example, the direction of the magnetization of the second ferromagnetic layer 20 is a direction substantially perpendicular to the film surface. The magnetization of the second ferromagnetic layer 20 is reversible relatively easily and is changeable in the stacking direction SD1. The second ferromagnetic layer 20 also performs the role of storing data. For example, the second ferromagnetic layer 20 functions as a magnetic memory layer.

The first nonmagnetic layer 10n functions as a first spacer layer. In the case where the first nonmagnetic layer 10n is a tunneling barrier layer based on an insulating material, the first stacked member SB1 that includes the first ferromagnetic layer 10, the first nonmagnetic layer 10n, and the second ferromagnetic layer 20 has, for example, a MTJ (Magnetic Tunnel Junction) structure.

In the third ferromagnetic layer 30, for example, the magnetization component projected onto the stacking direction SD1 is smaller than the magnetization component projected onto a direction perpendicular to the stacking direction SD1. The easy magnetization axis of the third ferromagnetic layer 30 is substantially parallel to the film surface. The direction of the magnetization of the third ferromagnetic layer is changeable in a direction perpendicular to the stacking direction SD1. The third ferromagnetic layer 30 performs the role of generating a high frequency magnetic field when programming. For example, the third ferromagnetic layer 30 functions as a magnetization rotation layer (a magnetic field generation layer).

For example, the fourth ferromagnetic layer 40 functions as a second fixed magnetic layer. For example, the direction of a magnetization 40m of the fourth ferromagnetic layer 40 is fixed in a direction substantially perpendicular to the film surface. The magnetization 40m of the fourth ferromagnetic layer 40 is fixed in a second direction having a stacking-direction component. The direction of the magnetization 40m of the fourth ferromagnetic layer 40 is a direction substantially perpendicular to the film surface. The second nonmagnetic layer 20n functions as a second spacer layer.

The first ferromagnetic layer 10, the second ferromagnetic layer 20, and the fourth ferromagnetic layer 40 include, for example, perpendicular magnetization films. The third ferromagnetic layer 30 includes, for example, an in-plane magnetization film.

Figures 2A, 2B:
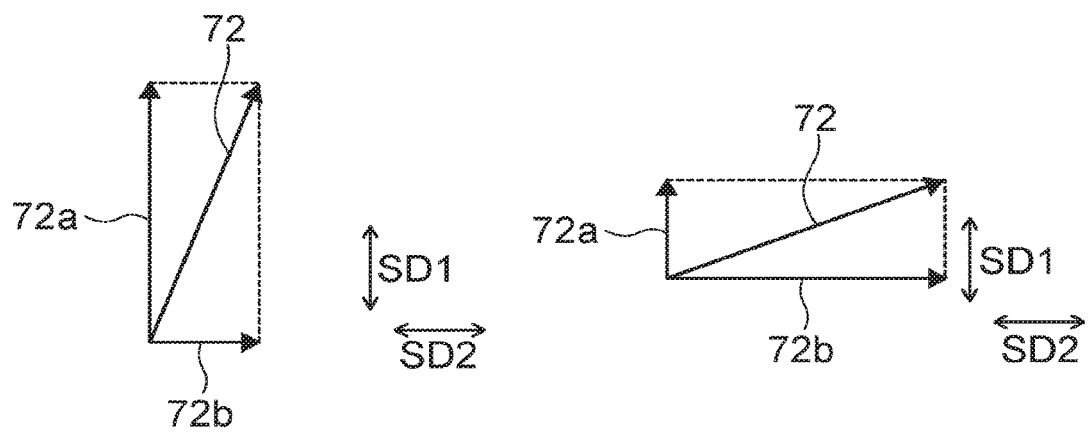
FIG. 2A and FIG. 2B are schematic views showing the magnetizations.

FIG. 2A and FIG. 2B are schematic views illustrating the magnetizations.

FIG. 2A shows the magnetization of a perpendicular magnetization film. FIG. 2B shows the magnetization of an in-plane magnetization film.

As shown in FIG. 2A and FIG. 2B, one direction perpendicular to the stacking direction SD1 is taken as an in-plane direction SD2. The in-plane direction SD2 is a direction in the X-Y plane. An in-plane magnetization component 72b of a magnetization 72 is the component of the magnetization 72 projected onto the X-Y plane. The in-plane magnetization component 72b is parallel to the in-plane direction SD2. A perpendicular magnetization component 72a of the magnetization 72 is the component of the magnetization 72 projected onto the Z-axis direction. The perpendicular magnetization component 72a is parallel to the stacking direction SD1.

As shown in FIG. 2A, the perpendicular magnetization film has a magnetization state in which the perpendicular magnetization component 72a is larger than the in-plane magnetization component 72b. For the operating characteristics, it is desirable for the direction of the magnetization to be substantially perpendicular to the film surface in the perpendicular magnetization film.

As shown in FIG. 2B, the in-plane magnetization film has a magnetization state in which the in-plane magnetization component 72b is larger than the perpendicular magnetization component 72a. For the operating characteristics, it is desirable for the direction of the magnetization to be substantially parallel to the film surface in the in-plane magnetization film.

For convenience of description, the direction from the first stacked member SB1 toward the second stacked member SB2 is called "up" or "upward." The direction from the second stacked member SB2 toward the first stacked member SB1 is called "down" or "downward."

As described above, the direction of the magnetization 10m of the first ferromagnetic layer 10 is substantially fixed. The direction of the magnetization 40m of the fourth ferromagnetic layer 40 is substantially fixed.

In the magnetic memory element 110 as shown in FIG. 1, the direction of the magnetization 10m of the first ferromagnetic layer 10 is upward; and the direction of the magnetization 40m of the fourth ferromagnetic layer 40 is downward. For example, the orientation of the stacking direction SD1 component of the magnetization 10m of the first ferromagnetic layer 10 is the reverse of the orientation of the stacking direction SD1 component of the magnetization 40m of the fourth ferromagnetic layer 40. However, various modifications of the direction of the magnetization 10m of the first ferromagnetic layer 10 and the direction of the magnetization 40m of the fourth ferromagnetic layer 40 are possible. For example, both the direction of the magnetization 10m of the first ferromagnetic layer 10 and the direction of the magnetization 40m of the fourth ferromagnetic layer 40 may be upward or downward; or one may be upward and the other may be downward.

In the magnetic memory element 110, for example, an electron current can be caused to flow in the first stacked member SB1 and the second stacked member SB2 via the first conductive layer 81 and the second conductive layer 82. The electron current is the flow of electrons. The electron current flows downward when the current flows upward.

A magnetization 30m of the third ferromagnetic layer 30 which is the magnetic field source precesses when the electron current is caused to flow in a direction perpendicular to the film surface. Thereby, a rotating magnetic field (a high frequency magnetic field) is generated. The frequency of the high frequency magnetic field is, for example, about 1 GHz to 60 GHz. The high frequency magnetic field has a component in a direction perpendicular to the direction of the magnetization 20m of the second ferromagnetic layer 20 (a component in the direction of the hard magnetization axis of the second ferromagnetic layer 20). Accordingly, at least a portion of the high frequency magnetic field generated by the third ferromagnetic layer 30 is applied in the direction of the hard magnetization axis of the second ferromagnetic layer 20. The magnetization 20m of the second ferromagnetic layer 20 reverses easily when the high frequency magnetic field generated by the third ferromagnetic layer 30 is applied in the direction of the hard magnetization axis of the second ferromagnetic layer 20.

In the magnetic memory element 110, the direction of the magnetization 20m of the second ferromagnetic layer 20 can be controlled by causing the electron current to flow in the first stacked member SB1 and the second stacked member SB2. Specifically, the orientation of the magnetization 20m of the second ferromagnetic layer 20 can be reversed by changing the orientation (the polarity) in which the electron current flows. In the case where information is stored, for example, "0" and "1" are allotted respectively according to the directions of the magnetization 20m of the second ferromagnetic layer 20. The magnetic memory element 110 has a first state, or a second state that is different from the first state. The first state and the second state correspond respectively to two different directions of the magnetization 20m of the second ferromagnetic layer 20.

As described above, it is favorable for the width (the diameter) of the third ferromagnetic layer 30 to be 35 nm or less. In the case where the width of the third ferromagnetic layer 30 is greater than 35 nm, for example, a vortex (a closure domain) occurs when the magnetization 30m of the third ferromagnetic layer 30 precesses. For example, the occurrence of the vortex can be suppressed by setting the equivalent circular diameter of the cross-sectional configuration of the third ferromagnetic layer 30 to be 35 nm or less and setting the thickness of the third ferromagnetic layer 30 to be not less than 0.5 nm and not more than 3.5 nm. Thereby, for example, the magnetization reversal of the second ferromagnetic layer 20 can be assisted by causing the high frequency magnetic field generated by the third ferromagnetic layer 30 to act more appropriately on the magnetization reversal of the second ferromagnetic layer 20. In other words, a magnetic field strength that is sufficient for the magnetization 20m to reverse can be obtained at the position of the second ferromagnetic layer 20.

It is desirable for the size to satisfy the relational expression $r < 0.419 t^2 - 2.86 t + 19.8$, where R (nm) is the equivalent circular diameter of the horizontal cross-sectional configuration (the cross-sectional configuration when cut by a plane perpendicular to the stacking direction SD1) of the third ferromagnetic layer 30, r (nm) is the value of half of R (=R/2), and t (nm) is the layer thickness.

In the specification of the application, the "equivalent circular diameter" is the diameter of an imaginary circle having the same surface area as the planar configuration of interest. For example, in the case where the horizontal cross-sectional configuration of the third ferromagnetic layer 30 is a circle, R means the diameter. In the case where the horizontal cross-sectional configuration of the third ferromagnetic layer 30 is an ellipse, R means the diameter of a circle having the same surface area as the ellipse. In the case where the horizontal cross-sectional configuration of the third ferromagnetic layer 30 is a polygon, R means the diameter of a circle having the same surface area as the polygon.

First, an example of a programming operation will be described as a specific example of the operations of the magnetic memory element 110.

FIG. 3A to FIG. 3D and FIG. 4A to FIG. 4D are schematic views illustrating operations of the memory device according to the first embodiment.

These drawings show states of the first stacked member SB1 and the second stacked member SB2 in the programming operation of the magnetic memory element 110. In the programming operation, the programming operation of the second ferromagnetic layer 20 is implemented by causing an electron current 60 (a programming current) to flow across the film surface of the first ferromagnetic layer 10 and the film surface of the second ferromagnetic layer 20. Here, the case is described where the magnetoresistance effect via the first nonmagnetic layer 10n is the normal type.

In the normal-type magnetoresistance effect, the electrical resistance when the magnetizations of the magnetic layers on two sides of the nonmagnetic layer are parallel to each other is lower than the electrical resistance when the magnetizations are antiparallel. In the case of the normal type, the electrical resistance between the first ferromagnetic layer 10 and the second ferromagnetic layer 20 via the first nonmagnetic layer 10n is lower when the direction of the magnetization 10m of the first ferromagnetic layer 10 is parallel to the direction of the magnetization 20m of the second ferromagnetic layer 20 than when antiparallel.

FIG. 3A to FIG. 3D show the case where the orientation of the magnetization 20m of the second ferromagnetic layer 20 is reversed from upward to downward.

Figure 3A:
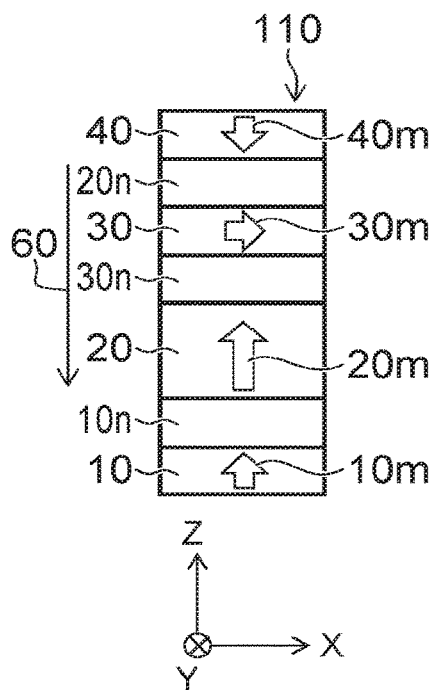
FIG. 3A to FIG. 3D are schematic views showing operations of the memory device according to the first embodiment.
Figure 3B:
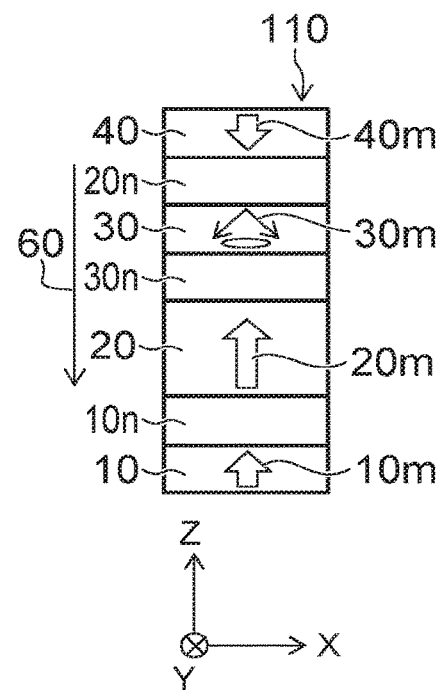
Figure 3C:
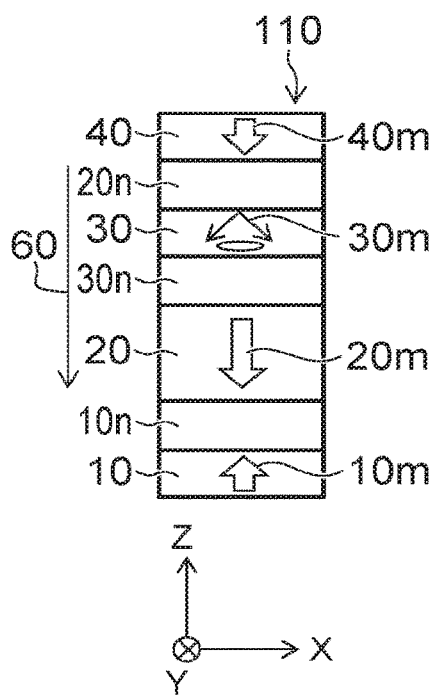
Figure 3D:
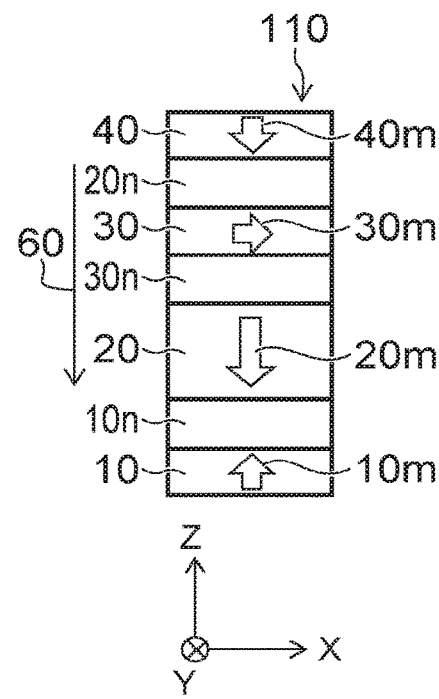

FIG. 3A shows the state in which the electron current 60 has started to flow. FIG. 3D shows the state in which the flow of the electron current 60 has ended (the state in which the magnetization 20m has reversed). FIG. 3B and FIG. 3C show intermediate states.

As shown in FIG. 3A, when the orientation of the magnetization 20m is reversed from upward to downward, the electron current 60 is caused to flow from the second stacked member SB2 toward the first stacked member SB1. In other words, the electron current 60 is caused to flow downward.

When the electron current 60 is caused to flow downward, the electrons that pass through the first nonmagnetic layer 10n and have spins of the same orientation as the direction of the magnetization 10m of the first ferromagnetic layer 10 (in the example, upward) pass through the first ferromagnetic layer 10. On the other hand, the electrons that have spins of the reverse orientation of the direction of the magnetization 10m of the first ferromagnetic layer 10 (in the example, downward) are reflected at the interface between the first ferromagnetic layer 10 and the first nonmagnetic layer 10n. The angular momentum of the spins of the reflected electrons is transferred to the second ferromagnetic layer 20 and acts on the magnetization 20m of the second ferromagnetic layer 20.

When the electron current 60 is caused to flow in the second stacked member SB2 as shown in FIG. 3B, the magnetization 30m of the third ferromagnetic layer 30 precesses and generates a rotating magnetic field. The electrons that pass through the fourth ferromagnetic layer 40, which has the magnetization 40m in a direction substantially perpendicular to the film surface, have spins in the same direction as the direction of the magnetization 40m of the fourth ferromagnetic layer 40. When the electrons flow into the third ferromagnetic layer 30, angular momentum of the spins is transferred to the third ferromagnetic layer 30 and acts on the magnetization 30m of the third ferromagnetic layer 30. In other words, a so-called spin-transfer torque acts. Thereby, the magnetization 30m precesses due to the supply of the electron current 60. The spin polarization of the electrons passing through the third ferromagnetic layer 30 is quenched by passing through the third nonmagnetic layer 30n.

When the magnetization 30m of the third ferromagnetic layer 30 precesses as shown in FIG. 3C, the orientation of the magnetization 20m is reversed from upward to downward by the action of the rotating magnetic field from the third ferromagnetic layer 30 and the action of the spin-polarized electrons reflected by the interface at the first ferromagnetic layer 10.

When the supply of the electron current 60 is stopped as shown in FIG. 3D, the precession of the magnetization 30m stops; and the orientation of the magnetization 20m is maintained in the state of being reversed from upward to downward. For example, "0" is allotted to the state of the second ferromagnetic layer 20 having the magnetization 20m of this orientation. In the magnetic memory element 110, for example, the state in which the orientation of the magnetization 20m of the second ferromagnetic layer 20 is downward corresponds to the first state.

FIG. 4A to FIG. 4D show the case where the orientation of the magnetization 20m is reversed from downward to upward.

Figure 4A:
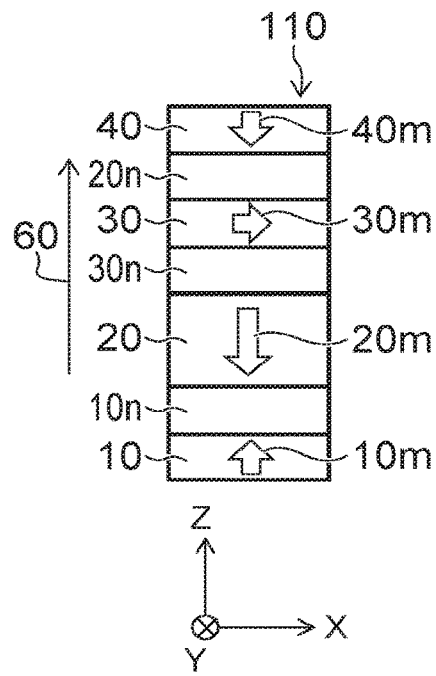
FIG. 4A to FIG. 4D are schematic views showing operations of the memory device according to the first embodiment.
Figure 4B:
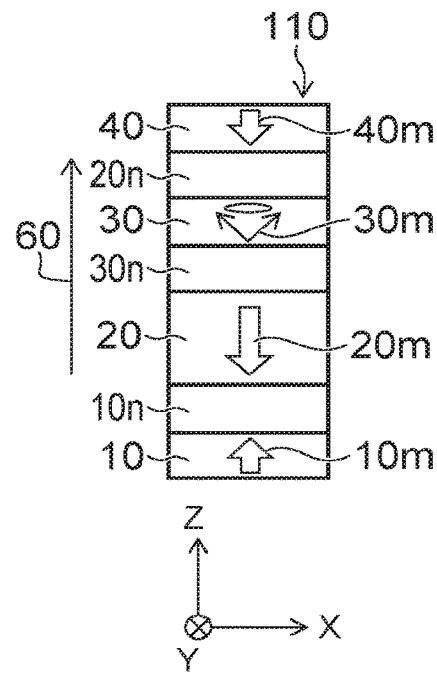
Figure 4C:
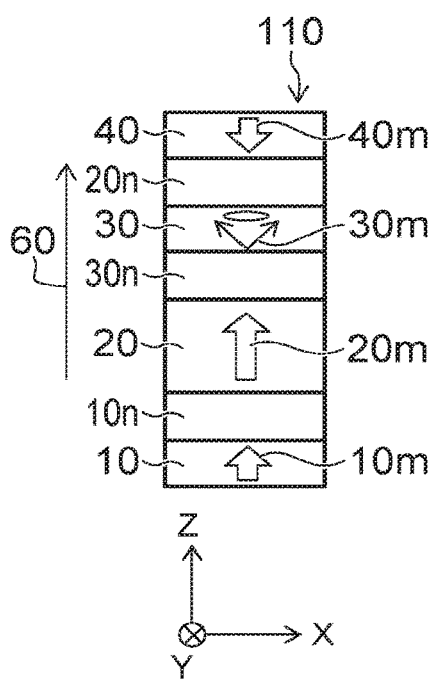
Figure 4D:
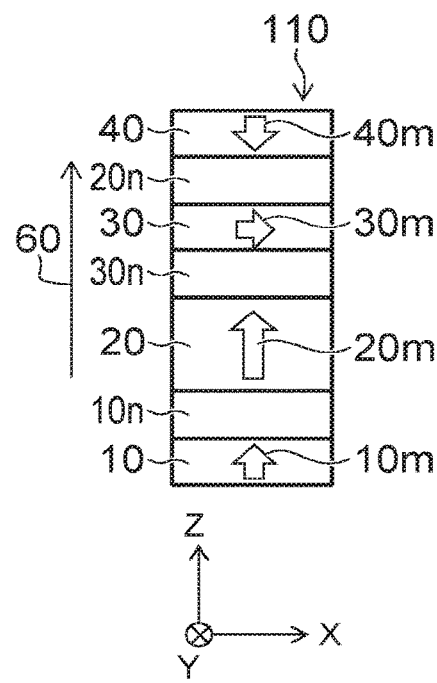

FIG. 4A shows the state in which the electron current 60 has started to flow. FIG. 4D shows the state in which the flow of the electron current 60 has ended (the state in which the magnetization 20m has reversed). FIG. 4B and FIG. 4C show intermediate states.

When the orientation of the magnetization 20m is reversed from downward to upward as shown in FIG. 4A, the electron current 60 is caused to flow from the first stacked member SB1 toward the second stacked member SB2. In other words, the electron current 60 is caused to flow upward.

When the electron current 60 is caused to flow as shown in FIG. 4B, the magnetization 30m of the third ferromagnetic layer 30 precesses and generates a rotating magnetic field. The electrons that have spins of the reverse orientation of the magnetization 40m of the fourth ferromagnetic layer 40 are reflected at the interface between the fourth ferromagnetic layer 40 and the second nonmagnetic layer 20n. The angular momentum of the spins of the reflected electrons is transferred to the third ferromagnetic layer 30 and acts on the magnetization 30m of the third ferromagnetic layer 30. Thereby, the magnetization 30m precesses.

When the electron current 60 is caused to flow upward, the electrons that have spins of the same orientation as the direction of the magnetization 10m of the first ferromagnetic layer 10 (in the example, upward) pass through the first ferromagnetic layer 10 and are transferred to the second ferromagnetic layer 20. Thereby, the action of the electrons having the upward spins and the action of the rotating magnetic field from the third ferromagnetic layer 30 act on the magnetization 20m.

As shown in FIG. 4C, the orientation of the magnetization 20m of the second ferromagnetic layer 20 is reversed from downward to upward by the action of the spin-polarized electrons and the action of the rotating magnetic field from the third ferromagnetic layer 30.

When the supply of the electron current 60 stops as shown in FIG. 4D, the precession of the magnetization 30m stops; and the state in which the orientation of the magnetization 20m is reversed from downward to upward is maintained. For example, "1" is allotted to the state of the second ferromagnetic layer 20 having the magnetization 20m of this orientation. In the magnetic memory element 110, for example, the state in which the orientation of the magnetization 20m of the second ferromagnetic layer 20 is upward corresponds to the second state.

Based on such actions, "0" and "1" are appropriately allotted respectively to the different multiple states of the second ferromagnetic layer 20. Thereby, the programming of the magnetic memory element 110 is implemented.

In the case where the magnetoresistance effect is the reverse type, the electrical resistance between the first ferromagnetic layer 10 and the second ferromagnetic layer 20 via the first nonmagnetic layer 10n is higher when the direction of the magnetization 10m of the first ferromagnetic layer 10 is parallel to the direction of the magnetization 20m of the second ferromagnetic layer 20 than when antiparallel. The programming operation of the reverse type is similar to the case of the normal type.

In the example, for example, the first state is "0;" and the second state is "1." The first state may be "1;" and the second state may be "0." The first state and the second state are not limited to "0" or "1" and may be other states. The number of states provided in the magnetic memory element 110 may be three or more. In other words, the magnetic memory element 110 may be a multi-bit memory element.

The setting of the first state or the second state is implemented by the controller 550. For example, the setting of the first state corresponds to programming; and the setting of the second state corresponds to erasing. The setting of the second state may correspond to programming; and the setting of the first state may correspond to erasing.

For example, the supply of the electron current 60 is performed by the controller 550. In the programming operation, for example, the controller 550 supplies the electron current 60 to the magnetic memory element 110 for 10 nanoseconds or more. Thereby, for example, the orientation of the magnetization 20m can be reversed appropriately by the supply of the electron current 60. More favorably, the supply is performed for 3 nanoseconds or more. Thereby, for example, the time necessary for the programming operation can be suppressed while appropriately reversing the magnetization.

An example of a read-out operation will now be described.

For example, the sensing of the direction of the magnetization 20m of the second ferromagnetic layer 20 of the magnetic memory element 110 is implemented by utilizing the magnetoresistance effect. In the magnetoresistance effect, the electrical resistance changes due to the relative orientations of the magnetizations of each layer. In the case where the magnetoresistance effect is utilized, for example, a sense current is caused to flow between the first ferromagnetic layer 10 and the second ferromagnetic layer 20; and the magnetoresistance is measured. The current value of the sense current is less than the value of a current corresponding to the electron current 60 caused to flow when programming (when storing).

Figure 5A:
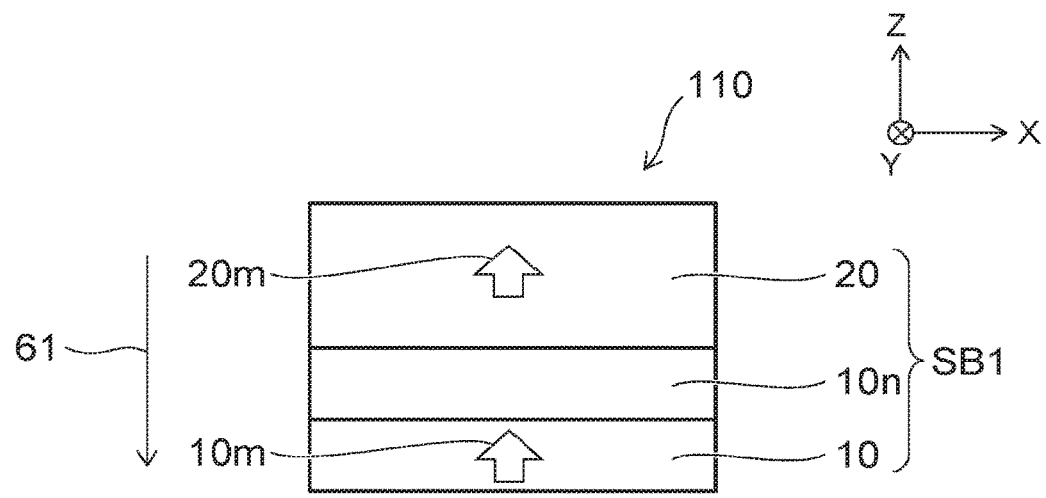
FIG. 5A and FIG. 5B are schematic views showing an operation of the memory device according to the first embodiment.
Figure 5B:
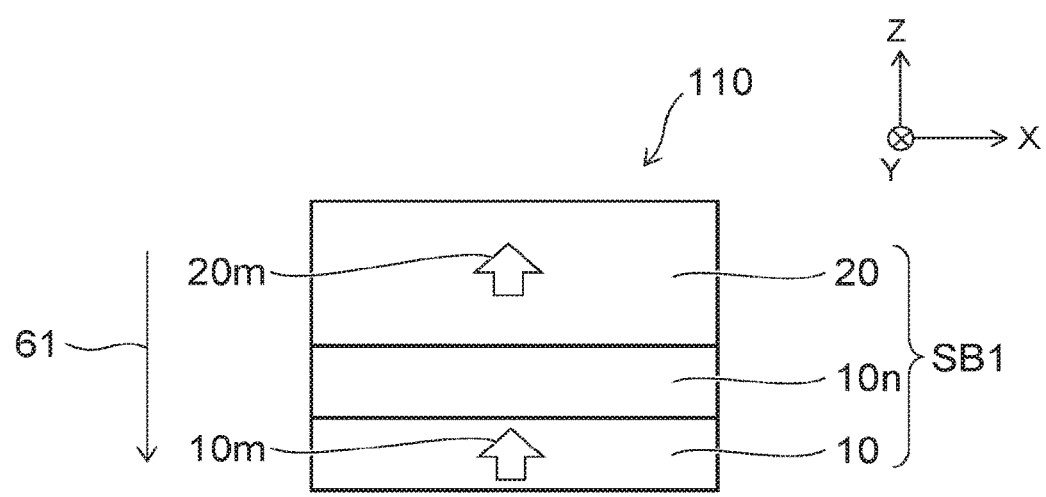

FIG. 5A and FIG. 5B are schematic views illustrating an operation of the memory device according to the first embodiment.

These drawings show the state of the first stacked member SB1 of the magnetic memory element 110 in the read-out operation. The second stacked member SB2, the first conductive layer 81, the second conductive layer 82, and the third nonmagnetic layer 30n are not shown in these drawings.

FIG. 5A shows the case where the direction of the magnetization 10m of the first ferromagnetic layer 10 is the same as the direction of the magnetization 20m of the second ferromagnetic layer 20. FIG. 5B shows the case where the direction of the magnetization 10m of the first ferromagnetic layer 10 is antiparallel (orientated reversely) to the direction of the magnetization 20m of the second ferromagnetic layer 20.

As shown in FIG. 5A and FIG. 5B, a sense current 61 is caused to flow in the first stacked member SB1; and the electrical resistance is sensed.

In the case of the normal magnetoresistance effect, the resistance in the state of FIG. 5A is lower than the resistance in the state of FIG. 5B. In the case of the reverse magnetoresistance effect, the resistance in the state of FIG. 5A is higher than the resistance in the state of FIG. 5B.

It is possible to read memory of binary data by associating the multiple states having mutually-different resistances with "0" and "1," respectively. The orientation of the sense current 61 may be the reverse orientation of the direction shown in FIG. 5A and FIG. 5B.

For example, the supply of the sense current 61 is performed by the controller 550. In the read-out operation, for example, the controller 550 supplies the sense current 61 to the magnetic memory element 110 for 3 nanoseconds or less. Thereby, for example, the reversal of the orientation of the magnetization 20m due to the supply of the sense current 61 can be suppressed. More favorably, the supply is for 1 nanosecond or less. Thereby, the reversal of the magnetization due to the supply of the sense current 61 can be suppressed more appropriately.

Thus, the controller 550 sets the time of supplying the current to the magnetic memory element 110 when programming to be longer than the time of supplying the current to the magnetic memory element 110 when reading. For example, the controller 550 supplies the current to the magnetic memory element 110 for a first time when programming, and supplies the current to the magnetic memory element 110 for a second time when reading. In such a case, the first time is longer than the second time. Thereby, for example, a stable programming operation and a stable read-out operation can be obtained.

A programming current of 10 nanoseconds to 30 nanoseconds is assumed for a memory operation corresponding to DRAM. On the other hand, a programming current of 1 nanosecond to 3 nanoseconds is assumed for an application corresponding to cache memory.

For example, the program time (the first time) is 10 nanoseconds or more; and the read-out time (the second time) is less than 10 nanoseconds. For a magnetization reversal of 3 nanoseconds or less, the current necessary for the reversal starts to increase because the magnetization is not easily affected by the heat (the assist effect of the heat). The vicinity of 1 nanosecond is called the dynamic region; and the current necessary for the reversal further increases because the magnetization is not affected by the heat.

Therefore, for example, the programming is performed for 10 nanoseconds or more; and the reading is performed for 3 nanoseconds or less. The misprogram rate can be reduced further by performing the programming for not less than 1 nanosecond and not more than 3 nanoseconds and performing the reading for 3 nanoseconds or less at a current value that is smaller than that of the programming.

In the magnetic memory element 110 as recited above, the second stacked member SB2 functions as a magnetic field source. The first stacked member SB1 functions as a magnetic memory unit. Hereinbelow, the second stacked member SB2 may be called a magnetic field source or a STO (Spin Torque Oscillator). On the other hand, the first stacked member SB1 may be called a magnetic memory unit or a MTJ.

As recited above, for example, the programming to the second ferromagnetic layer 20 which is the memory layer of the MTJ element is performed by spin torque programming. In such a magnetic memory element 110, it is desirable for the width of the magnetic memory element 110 to be, for example, 35 nm or less due to the demand for higher bit density. The width of the magnetic memory element 110 is, for example, the length of the magnetic memory element 110 in the X-axis direction or the Y-axis direction. In the case where the configuration of the magnetic memory element 110 projected onto the X-Y plane is a circle or an ellipse, the width of the magnetic memory element 110 is the diameter (the major diameter) of the magnetic memory element 110.

Figure 6:
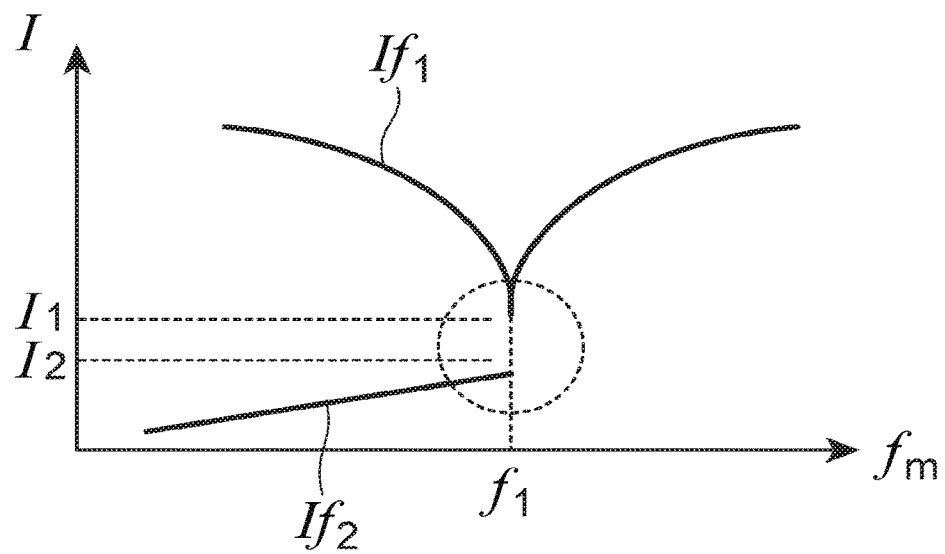
FIG. 6 is a graph of characteristics of the memory device according to the first embodiment.

FIG. 6 is a graph of characteristics of the memory device according to the first embodiment.

FIG. 6 shows a characteristic If1 of the first stacked member SB1 and a characteristic If2 of the second stacked member SB2 of the magnetic memory element 110 according to the embodiment.

The vertical axis of FIG. 6 is a current I flowing through the first stacked member SB1 or the second stacked member SB2. The horizontal axis of FIG. 6 is a frequency fm of the magnetic field.

The characteristic If1 of the first stacked member SB1 shows the current I at which the magnetization 20m of the second ferromagnetic layer 20 reverses in the state in which an external magnetic field of the frequency fm is applied to the second ferromagnetic layer 20 of the first stacked member SB1.

For example, the characteristic If1 is obtained by simulation. In the simulation of calculating the characteristic If1, for example, the value of the current flowing in the second stacked member SB2 is set to be zero. The characteristic If1 is the characteristic of the solitary MTJ (memory layer). The characteristic If1 is the relationship between the reversal current (the current at which the magnetization 20m of the second ferromagnetic layer 20 reverses) and the frequency of the magnetic field when a magnetic field in the GHz band is applied to the memory layer from the outside.

For example, a first frequency f1 is the magnetic resonance frequency of the second ferromagnetic layer 20 of the first stacked member SB1. For example, for the characteristic If1 of the solitary MTJ as shown in FIG. 6, the reversal current has a minimum when the magnetic field of the first frequency f1 is applied. For example, the reversal current at this time is a first current I1.

In other words, a current (the first current I1) is caused to flow in the first stacked member SB1 along the stacking direction and the external magnetic field of the first frequency f1 is applied for the solitary MTJ (when the current is not flowing in the second stacked member SB2). Thereby, the direction of the magnetization 20m of the second ferromagnetic layer 20 can be changed to a direction corresponding to the orientation of the first current. When a second current I2 that is smaller than the first current I1 flows in the first stacked member SB1, the direction of the magnetization 20m of the second ferromagnetic layer 20 does not change to the direction corresponding to the orientation of the second current I2.

The characteristic If2 of the second stacked member SB2 shows the relationship between the current I and the frequency fm of the magnetic field generated by the precession of the magnetization 30m of the third ferromagnetic layer 30 when the current I is caused to flow in the second stacked member SB2. For example, the characteristic If2 is obtained by simulation and is the characteristic of the solitary second stacked member SB2 (the magnetic field generation layer).

As shown in FIG. 6, the magnetization 30m of the third ferromagnetic layer 30 can generate a magnetic field oscillating at the first frequency f1 when the second current I2 is caused to flow in the second stacked member SB2 along the stacking direction. The second current I2 is smaller than the first current I1.

Thus, in the magnetic memory element 110 according to the embodiment, the third ferromagnetic layer 30 can generate a magnetic field of a frequency that is the same as or higher than the first frequency f1 when a current that is small compared to the magnetization reversal current at the resonance frequency of the memory layer flows. In the magnetic memory element 110, such a memory layer (the second ferromagnetic layer 20) and the magnetic field generation layer (the third ferromagnetic layer 30) have magnetostatic coupling.

The inventor of the application discovered that the reversal current of the magnetic memory element 110 can be smaller than the first current I1 by providing the memory layer and the magnetic field generation layer with such magnetostatic coupling.

In other words, the memory layer is stacked with a magnetic field generation layer in which the slope of the oscillation characteristic (the current dependence of the oscillation frequency) of the magnetization is large. For example, the slope of the oscillation characteristic of the magnetization of the magnetic field generation layer is larger than the first frequency f1/first current I1. Thereby, it was discovered that the programming to the memory layer can be performed using a smaller current.

For example, the magnetic resonance frequency of the second ferromagnetic layer 20 can be measured by utilizing a damping measurement method. For example, the measurement is performed by causing probes to contact one end of the first stacked member SB1 and one end of the second stacked member SB2. In such a case, there is a possibility that multiple magnetic resonance frequencies may be measured. The material and composition of the second ferromagnetic layer can be determined using mass spectrometry, X-ray analysis, etc. The resonance frequency of the second ferromagnetic layer 20 can be identified from the frequency that coincides with the resonance frequency band that can be estimated from the material. Thereby, the characteristic If1 of the first stacked member SB1 can be measured.

The magnetic resonance frequency also can be determined by measuring the spectrum of the ferromagnetic resonance (FMR).

The oscillation characteristic of the third ferromagnetic layer 30 is measured by causing probes to contact one end of the first stacked member SB1 and one end of the second stacked member SB2. The oscillation characteristic of the third ferromagnetic layer 30 is determined by measuring the magnetic field that is generated for the current flowing in the second stacked member SB2.

Also, for example, the material, composition, etc., of the third ferromagnetic layer 30 can be determined using mass spectrometry, X-ray analysis, etc. Thereby, for example, the oscillation characteristic of the third ferromagnetic layer 30 can be determined.

For example, such a magnetic memory element is designed as follows.

For the memory layer (the solitary first stacked member SB1), the current at which the magnetization 20m of the second ferromagnetic layer 20 reverses when the high frequency magnetic field is applied from the outside is measured. Thereby, for example, a graph of the frequency characteristic for the reversal current of the memory layer such as the characteristic If1 of FIG. 6 is obtained. Here, the resonance frequency (the first frequency f1) and the reversal current (the first current I1) are focused upon. Then, the magnetic field generation layer is designed so that the slope of the current dependence of the oscillation characteristic of the magnetic field generation layer (the solitary second stacked member SB2) is larger than the first frequency f1/first current I1.

For example, the magnetic field generation layer has the following relationship between an oscillation frequency f and a current density J.

$$f = \gamma/(2\pi\alpha)(h(\text{bar})/2e)(g(\theta)/M_s t)J,$$

$$f = \gamma/(2\pi\alpha)(h(\text{bar})/2e)(g(\theta)/M_s V)I$$

$\gamma$ is the gyro time constant. $\alpha$ is the damping constant. $h(\text{bar})$ is the value of the Planck's constant divided by $2\pi$. $g(\theta)$ is the spin injection efficiency. $M_s$ is the magnetization of the magnetic field generation layer (the third ferromagnetic layer 30). $t$ is the thickness (the length along the stacking direction) of the magnetic field generation layer. $V$ is the volume of the magnetic field generation layer.

In the formula recited above, the slope of the oscillation characteristic of the second ferromagnetic layer 20 is expressed by f/I. For example, the magnetic field generation layer is designed so that the slope f/I is larger than (the first frequency f1)/(first current I1).

For example, the spin injection efficiency $g(\theta)$ is set to be large. Or, at least one of the damping coefficient $\alpha$, the magnetization $M_s$, or the thickness t is set to be small. Thereby, the slope f/I can be set to be large.

Thus, the current that is caused to flow in the MTJ in the programming operation can be reduced by stacking the memory layer with the magnetic field generation layer in which the slope of the oscillation characteristic is large. Thereby, failures due to breakdown of the insulating film (the first nonmagnetic layer 10n) of the MTJ due to the applied voltage can be suppressed. According to the embodiment, a magnetic memory element and a memory device that have high reliability can be provided.

Examples of the configurations of each layer of the magnetic memory element 110 will now be described. The description recited below is applicable to any magnetic memory element according to the embodiment.

It is favorable for the first ferromagnetic layer 10 and the second ferromagnetic layer 20 to include, for example, a metal material including at least one element selected from the group consisting of iron (Fe), cobalt (Co), nickel (Ni), manganese (Mn), and chrome (Cr). An alloy including the at least one selected from the group recited above and at least one metal selected from the group consisting of platinum (Pt), palladium (Pd), iridium (Ir), ruthenium (Ru), and rhodium (Rh) also may be used.

The compositions of the magnetic materials included in the first ferromagnetic layer 10 and the second ferromagnetic layer 20, the conditions of the heat treatment of the first ferromagnetic layer 10 and the second ferromagnetic layer 20, etc., are adjusted. Thereby, for example, the characteristics of the first ferromagnetic layer 10 and the second ferromagnetic layer 20 such as the magnetization amount, the magnetic anisotropy, etc., can be adjusted. The first ferromagnetic layer 10 and the second ferromagnetic layer 20 may include, for example, a rare earth-transition metal amorphous alloy such as TbFeCo, GdFeCo, etc. For example, the first ferromagnetic layer 10 and the second ferromagnetic layer 20 may have a stacked structure of Co/Pt, Co/Pd, Co/Ni, etc. Co/Ru, Fe/Au, Ni/Cu, etc., become perpendicular magnetization films when combined with a foundation layer. By controlling the crystal orientation direction of the film, the first ferromagnetic layer 10 and the second ferromagnetic layer 20 may include Co/Ru, Fe/Au, Ni/Cu, etc. The first ferromagnetic layer 10 and the second ferromagnetic layer 20 may include, for example, an additive such as aluminum (Al), germanium (Ge), nitrogen (N), phosphorus (P), arsenic (As), boron (B), silicon (Si), etc.

The first nonmagnetic layer 10n may include, for example, an insulating material that functions as a nonmagnetic tunneling barrier layer. Specifically, for example, an oxide, a nitride, or a fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used. The nonmagnetic tunneling barrier layer is, for example, a nonmagnetic layer that includes an insulator and in which a current (a tunneling current) flows due to tunneling when a voltage is applied. The thickness of the nonmagnetic tunneling barrier layer is, for example, 2 nm or less. Thereby, when the voltage is applied, the tunneling current flows in the nonmagnetic tunneling barrier layer.

The first nonmagnetic layer 10n may include, for example, $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, Si—N—O, etc. The first nonmagnetic layer 10n may include, for example, a nonmagnetic semiconductor (ZnOx, InMn, GaN, GaAs, TiOx, Zn, Te, or one of these doped with a transition metal), etc.

It is desirable for the thickness of the first nonmagnetic layer 10n to have a value in the range of not less than about 0.2 nanometers (nm) and not more than about 2.0 nm. Thereby, for example, a resistance that is excessively high is suppressed while ensuring the uniformity of the insulating film.

The second nonmagnetic layer 20n may include, for example, one of a nonmagnetic tunneling barrier layer or a nonmagnetic metal layer.

In the case where the nonmagnetic tunneling barrier layer is used as the second nonmagnetic layer 20n, the second nonmagnetic layer 20n may include, for example, the same material as the material described in regard to the first nonmagnetic layer 10n. In such a case, it is desirable for the thickness of the second nonmagnetic layer 20n to have a value in the range of not less than about 0.2 nm and not more than about 2.0 nm.

The nonmagnetic metal layer that is included in the second nonmagnetic layer 20n may include, for example, one nonmagnetic metal selected from the group consisting of copper (Cu), silver (Ag), gold (Au), chrome (Cr), zinc (Zn), gallium (Ga), niobium (Nb), molybdenum (Mo), ruthenium (Ru), palladium (Pd), hafnium (Hf), tantalum (Ta), tungsten (W), platinum (Pt), and bismuth (Bi), or an alloy including at least two elements selected from the group recited above. In the case where the nonmagnetic metal layer is used as the second nonmagnetic layer 20n, it is desirable for the thickness of the second nonmagnetic layer 20n to be not less than 1.5 nm and not more than 20 nm. Thereby, inter-layer coupling does not occur between the magnetic layers; and the loss of the spin-polarized state of the conduction electrons when passing through the nonmagnetic metal layer can be suppressed.

For example, the third ferromagnetic layer 30 includes a Heusler alloy. For example, a Heusler alloy including at least one selected from the group consisting of Co, Mn, Fe, Ni, Cu, Rh, Ru, and Pd is used. For example, the spin injection efficiency $g(\theta)$ of the Heusler alloy is high. Thereby, for example, the slope f/J of the formula described above can be set to be large. In other words, the oscillation frequency for the current can be set to be high.

For example, the Heusler alloy includes at least one selected from the group consisting of $Co_2MnGa$, $Co_2MnAl$, $Ni_2MnIn$, $Ni_2MnGa$, $Ni_2MnSn$, $Pd_2MnSb$, $Pd_2MnSn$, $Cu_2MnAl$, $Cu_2MnSn$, $Cu_2MnIn$, $Rh_2MnGe$, and $Rh_2MnPb$.

The magnetization Ms is relatively small for such Heusler alloys. For example, the magnetization Ms is 800 emu/cc or less. For example, by using such a Heusler alloy, the slope f/J of the formula described above can be increased further.

For example, the Heusler alloy may include at least one selected from the group consisting of $Co_2FeSi$, $Co_2FeAl$, $Co_2FeGa$, $Co_2MnGe$, $Co_2MnSn$, and $Co_2MnSi$.

The magnetization Ms is relatively large for such Heusler alloys. For example, the magnetization Ms is not less than 800 emu/cc and not more than 1000 emu/cc. Thereby, for example, the magnetic field that is generated by the oscillation of the magnetization of the third ferromagnetic layer 30 can be set to be large. The magnetization of the second ferromagnetic layer 20 reverses easily due to the magnetization of the third ferromagnetic layer 30. In other words, the reversal current can be reduced.

It is desirable to use such a Heusler alloy in the embodiment. Thereby, the oscillation frequency of the magnetic field generation layer for the current can be set to be large.

The reversal current can be reduced by providing such a magnetic field generation layer and the memory layer with magnetostatic coupling.

For example, in the case where the third ferromagnetic layer 30 includes the Heusler alloy, there are cases where a leakage magnetic field to the periphery is generated by the magnetization of the third ferromagnetic layer 30. For example, the leakage magnetic field may undesirably affect the adjacent memory cell (referring to FIG. 17). In the embodiment, it is desirable to use a magnetic shield 51 (referring to FIG. 16) described below. Thereby, the leakage magnetic field can be suppressed.

It is favorable for the fourth ferromagnetic layer 40 to include, for example, a metal material including at least one element selected from the group consisting of iron (Fe), cobalt (Co), nickel (Ni), manganese (Mn), and chrome (Cr). An alloy including the metal material and at least one element selected from the group consisting of platinum (Pt), palladium (Pd), iridium (Ir), ruthenium (Ru), and rhodium (Rh) may be used.

For example, the characteristics of the fourth ferromagnetic layer 40 such as the magnetization amount, the magnetic anisotropy, etc., can be adjusted by adjusting the magnetic material and composition of the magnetic material included in the fourth ferromagnetic layer 40, the conditions of the heat treatment of the fourth ferromagnetic layer 40, etc. The fourth ferromagnetic layer 40 may be, for example, a rare earth-transition metal amorphous alloy such as TbFeCo, GdFeCo, etc. The fourth ferromagnetic layer 40 may have a stacked structure of Co/Pt, Co/Pd, Co/Ni, etc. Co/Ru, Fe/Au, Ni/Cu, etc., become perpendicular magnetization films when combined with a foundation layer. By controlling the crystal orientation direction of the film, Co/Ru, Fe/Au, Ni/Cu, etc., may be used as the fourth ferromagnetic layer 40.

The third nonmagnetic layer 30n includes, for example, a nonmagnetic metal layer.

The nonmagnetic metal layer that is included in the third nonmagnetic layer 30n may include, for example, at least one nonmagnetic metal selected from the group consisting of copper (Cu), silver (Ag), gold (Au), chrome (Cr), zinc (Zn), gallium (Ga), niobium (Nb), molybdenum (Mo), ruthenium (Ru), palladium (Pd), hafnium (Hf), tantalum (Ta), titanium (Ti), tungsten (W), platinum (Pt), bismuth (Bi), iridium (Ir), and osmium (Os), or an alloy including at least two nonmagnetic metals selected from the group recited above.

The nonmagnetic metal layer that is included in the third nonmagnetic layer 30n may be, for example, at least one of a conductive nitride, a conductive oxide, or a conductive fluoride, including at least one element selected from the group recited above. For example, the third nonmagnetic layer 30n may include, for example, TiN, TaN, etc. The third nonmagnetic layer 30n may include a stacked film in which films of these materials are stacked. The third nonmagnetic layer 30n may include, for example, a stacked film of a Ti film/Ru film/Ti film, etc.

The third nonmagnetic layer 30n may include a material having a long spin diffusion length such as copper (Cu), etc., or a material having a short spin diffusion length such as ruthenium (Ru), etc. The spin polarization of the flowing electrons can be quenched easily by the third nonmagnetic layer 30n including the material having the short spin diffusion length such as ruthenium (Ru), etc.

The first conductive layer 81 and the second conductive layer 82 include, for example, a conductive magnetic material or a conductive nonmagnetic material. For example, substantially the same material as the material included in the third ferromagnetic layer 30 and the fourth ferromagnetic layer 40 may be used as the conductive magnetic material.

The conductive nonmagnetic material that is included in the first conductive layer 81 and the second conductive layer 82 may include, for example, one metal selected from the group consisting of gold (Au), copper (Cu), chrome (Cr), zinc (Zn), gallium (Ga), niobium (Nb), molybdenum (Mo), ruthenium (Ru), palladium (Pd), silver (Ag), hafnium (Hf), tantalum (Ta), titanium (Ti), tungsten (W), platinum (Pt), bismuth (Bi), and aluminum (Al), or an alloy including at least two metals selected from the group recited above.

The conductive nonmagnetic material that is included in the first conductive layer 81 and the second conductive layer 82 may be at least one of a conductive nitride, a conductive oxide, or a conductive fluoride that includes at least one element selected from the group recited above.

The conductive nonmagnetic material that is included in the first conductive layer 81 and the second conductive layer 82 may be a carbon nanotube, a carbon nanowire, graphene, etc.

Conductive protective films may be provided for the first conductive layer 81 and the second conductive layer 82. In such a case, the protective film may include, for example, an alloy including at least one element selected from the group consisting of tantalum (Ta), ruthenium (Ru), copper (Cu), gold (Au), silver (Ag), aluminum (Al), copper (Cu), gold (Au), silver (Ag), and aluminum (Al), a material such as graphene, etc. When considering electromigration resistance and low resistance, it is desirable for the protective film to include one element selected from the group consisting of copper (Cu) and aluminum (Al), or an alloy including these elements.

A transistor may be connected directly or indirectly to at least one of the first conductive layer 81 or the second conductive layer 82. In such a case, for example, the source or the drain of the transistor may be used as the at least one of the first conductive layer 81 or the second conductive layer 82 recited above. Also, in such a case, for example, a contact that is connected to the source or the drain of the transistor may be used as the at least one of the first conductive layer 81 or the second conductive layer 82 recited above.

The configuration of the first stacked member SB1 and the configuration of the second stacked member SB2 when projected onto the X-Y plane are arbitrary. The configuration of the first stacked member SB1 and the configuration of the second stacked member SB2 when projected onto the X-Y plane are, for example, circles, ellipses, flattened circles, polygons, etc. In the case of a polygon, it is favorable to have three or more corners such as a quadrilateral, a hexagon, etc. The polygon may have a rounded-corner configuration.

The configurations of the first stacked member SB1 and the second stacked member SB2 when projected onto a plane (e.g., the Z-X plane or the Z-Y plane) parallel to the Z-axis are arbitrary. For example, the configuration of the first stacked member SB1 and the configuration of the second stacked member SB2 when projected onto the plane parallel to the Z-axis (the configurations cut by a plane perpendicular to the film surface) may have a tapered configuration or a reverse-tapered configuration.

An example of a method for manufacturing the magnetic memory element 110 according to the first embodiment will now be described. The manufacturing method recited below is applicable to not only the magnetic memory element 110 but also other magnetic memory elements according to the embodiments described below by appropriately modifying the order of making the layers. In the following description, "material A/material B" means that material B is stacked on material A.

After forming a lower electrode (not shown) on a wafer, the wafer is disposed inside an ultra high vacuum sputtering apparatus. Ta/Ru (a stopper layer/contact layer for a lower electrode), an FePt layer/CoFeB (the first ferromagnetic layer 10), MgO (the first nonmagnetic layer 10n), a CoFeB layer (a memory layer), and a Ru layer (the third nonmagnetic layer 30n) are stacked in this order on the lower electrode. Here, it is also possible to adjust the strength of the magnetic anisotropy in the direction perpendicular to the film surface between the CoFeB and the FePt layer/CoFeB by annealing in a magnetic field. Continuing, a Py layer/Cu/CoFeB/FePt layer (a magnetic field generator) and a Ru/Ta layer (an upper contact layer) are stacked in this order. Thereby, a patterning body is formed.

Then, a resist mask having a diameter of 30 nm is formed by coating an EB (electron beam) resist and performing EB exposure. The portion of the patterning body that is not covered with the resist is cut away by ion milling until the Ta layer of the stopper layer/contact layer for the lower electrode is exposed.

Subsequently, a SiN film that is used to form a protective insulating layer is formed to cover the stacked structure SB0.

Then, a $SiO_2$ film that is used to form a burying insulating layer is formed; subsequently, planarizing by CMP (Chemical Mechanical Polishing), etc., is performed; and subsequently, the upper contact layer for the electrode is exposed by etching the entire surface by RIE (Reactive Ion Etching), etc.

A resist is coated onto the entire surface; and the resist is patterned using a stepper lithography apparatus so that the openings of the resist correspond to the positions of the upper electrodes. A Cu film is formed to fill the openings corresponding to the upper electrodes; and the resist is removed. Thereby, the upper electrodes are formed. Interconnects (not shown) that are electrically connected to the upper electrodes are provided.

Thereby, the magnetic memory element 110 is completed.

Figure 7:
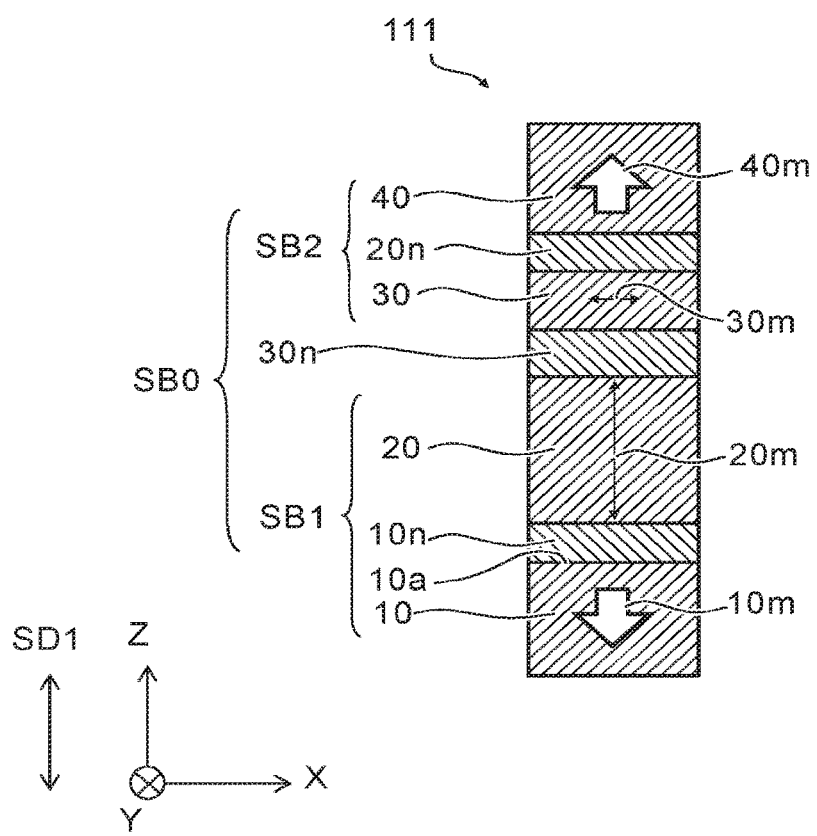
FIG. 7 is a schematic cross-sectional view showing a magnetic memory element according to the first embodiment.

FIG. 7 is a schematic cross-sectional view illustrating a magnetic memory element according to the first embodiment.

In the magnetic memory element 111 as shown in FIG. 7, the orientation of the magnetization 10m of the first ferromagnetic layer 10 is downward; and the orientation of the magnetization 40m of the fourth ferromagnetic layer 40 is upward. Thus, the orientation of the magnetization 10m and the orientation of the magnetization 40m respectively may be the reverse orientations of the orientation of the magnetization 10m and the orientation of the magnetization 40m of the magnetic memory element 110.

When spin information is retained in the third nonmagnetic layer 30n of the magnetic memory elements 110 and 111, the third ferromagnetic layer 30 is affected by the spin-transfer torque from the second ferromagnetic layer 20. Therefore, the controllability of the magnetization rotation of the third ferromagnetic layer 30 may degrade.

In such a case, for example, as the third nonmagnetic layer 30n, it is desirable to use a film having a short spin diffusion length (a material having the function of spin quenching) such as ruthenium (Ru), etc., or a layer having a structure having a short spin diffusion length. Thereby, the degradation of the controllability of the magnetization rotation of the third ferromagnetic layer 30 can be suppressed.

In other words, the magnitude of the spin-transfer torque for the magnetization 30m of the third ferromagnetic layer 30 to precess is determined by the spin polarization at the fourth ferromagnetic layer 40. In such a configuration, it is possible to control the magnetization 30m of the third ferromagnetic layer 30 independently without being affected by the spins of other electrons (spin-transfer torque).

As a material to obtain such a spin-quenching effect for the third nonmagnetic layer 30n, a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V), or an alloy including at least two selected from the group may be used.

It is desirable for the thickness of the third nonmagnetic layer 30n to be 1.4 nm or more.

In the case where the thickness of the third nonmagnetic layer 30n is 1.4 nm or more, in the third nonmagnetic layer 30n, the spin polarization can be quenched when the conduction electrons pass through the interface and interior of the third nonmagnetic layer 30n. The change of the precession of the third ferromagnetic layer 30 due to the orientation of the magnetization 20m of the second ferromagnetic layer 20 can be prevented by the third nonmagnetic layer 30n.

On the other hand, in the case where the thickness of the third nonmagnetic layer 30n exceeds 20 nm, it is difficult to form the multilayered film in a pillar. Also, the strength of the rotating magnetic field generated by the third ferromagnetic layer 30 attenuates at the position of the second ferromagnetic layer 20. Therefore, it is desirable for the thickness of the third nonmagnetic layer 30n to be 20 nm or less.

Other than the single-layer films described above, a stacked film may be used as the third nonmagnetic layer 30n. For example, the stacked film may have a stacked configuration of a layer including a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including at least two selected from the group, and a copper (Cu) layer stacked on at least one side of the layer including the metal or the alloy.

For example, the stacked film included in the third nonmagnetic layer 30n may have a stacked configuration including a first layer and a second layer, where the first layer includes a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including at least two selected from the group, and the second layer is stacked on at least one side of the first layer and includes an oxide including at least one element selected from the group consisting of aluminum (Al), magnesium (Mg), titanium (Ti), iron (Fe), cobalt (Co), nickel (Ni), vanadium (V), chrome (Cr), tantalum (Ta), tungsten (W), and ruthenium (Ru).

FIG. 8A to FIG. 8J are schematic cross-sectional views illustrating magnetic memory elements according to the first embodiment.

As shown in FIG. 8A to FIG. 8F, the second ferromagnetic layer 20, the first nonmagnetic layer 10n, the first ferromagnetic layer 10, the third nonmagnetic layer 30n, the fourth ferromagnetic layer 40, the second nonmagnetic layer 20n, and the third ferromagnetic layer 30 are stacked in this order in the magnetic memory elements 121 to 126. Thus, the stacking order of the stacked structure SB0 may be the orders shown in FIG. 8A to FIG. 8F.

In the magnetic memory element 121 and the magnetic memory element 122, the orientation of the stacking direction SD1 component of the magnetization 10m of the first ferromagnetic layer 10 is the reverse of the orientation of the stacking direction SD1 component of the magnetization 40m of the fourth ferromagnetic layer 40. Thereby, for example, the effects of the leakage magnetic field due to the magnetization 10m of the first ferromagnetic layer 10 and the magnetization 40m of the fourth ferromagnetic layer 40 at the position of the second ferromagnetic layer 20 can be suppressed.

In the magnetic memory element 121 and the magnetic memory element 122, the first ferromagnetic layer 10 and the fourth ferromagnetic layer 40 may have antiferromagnetic coupling via the third nonmagnetic layer 30n. Such a structure in which the directions of the magnetizations have antiferromagnetic coupling via the nonmagnetic layer and are antiparallel to each other is called a synthetic antiferromagnetic (SAF) structure. In the example, the stacked structure of the first magnetic layer (e.g., the first ferromagnetic layer 10)/nonmagnetic layer (e.g., the third nonmagnetic layer 30n)/second magnetic layer (e.g., the fourth ferromagnetic layer 40) corresponds to a SAF structure.

By using the SAF structure, the respective magnetization fixing powers are increased; the immunity to the external magnetic field can be improved; and the thermal stability can be improved. In such a structure, the leakage magnetic field applied in the direction perpendicular to the film surface at the position of the magnetic memory layer (e.g., the second ferromagnetic layer 20) is substantially zero.

The nonmagnetic layer (the intermediate layer) of the SAF structure may include a metal material such as ruthenium (Ru), iridium (Ir), osmium (Os), etc. For example, the thickness of the nonmagnetic layer is set to be 3 nm or less. Thereby, a sufficiently strong antiferromagnetic coupling via the nonmagnetic layer is obtained.

In other words, the third nonmagnetic layer 30n includes, for example, one metal selected from the group consisting of ruthenium (Ru), osmium (Os), and iridium (Ir), or an alloy including at least two metals selected from the group. The thickness of the third nonmagnetic layer 30n is, for example, 3 nm or less.

In the magnetic memory element 123 and the magnetic memory element 124, the orientation of the stacking direction SD1 component of the magnetization 10m of the first ferromagnetic layer 10 is the same as the orientation of the stacking direction SD1 component of the magnetization 40m of the fourth ferromagnetic layer 40. Thus, the orientation of the magnetization 10m may be parallel to the orientation of the magnetization 40m.

In the magnetic memory element 125 and the magnetic memory element 126, the orientation of the magnetization 10m and the orientation of the magnetization 40m are tilted with respect to the stacking direction SD1. The orientation of the magnetization 10m and the orientation of the magnetization 40m may not be parallel to the stacking direction SD1. It is sufficient for the orientation of the magnetization 10m and the orientation of the magnetization 40m to have at least a component in the stacking direction SD1.

In a magnetic memory element 127 and a magnetic memory element 128 as shown in FIG. 8G and FIG. 8H, the first ferromagnetic layer 10, the first nonmagnetic layer 10n, the second ferromagnetic layer 20, the third nonmagnetic layer 30n, the fourth ferromagnetic layer 40, the second nonmagnetic layer 20n, and the third ferromagnetic layer 30 are stacked in this order. Thus, the stacking order of the stacked structure SB0 may be the orders shown in FIG. 8G and FIG. 8H.

In a magnetic memory element 129 and a magnetic memory element 130 as shown in FIG. 8I and FIG. 8J, the second ferromagnetic layer 20, the first nonmagnetic layer 10n, the first ferromagnetic layer 10, the third nonmagnetic layer 30n, the third ferromagnetic layer 30, the second nonmagnetic layer 20n, and the fourth ferromagnetic layer 40 are stacked in this order. Thus, the stacking order of the stacked structure SB0 may be the orders shown in FIG. 8I and FIG. 8J.

In the magnetic memory element 123, 124, 127, 128, 129, or 130, a programming current $I_w$ is caused to flow in the stacked structure SB0 via the first conductive layer 81 and the second conductive layer 82. The orientation of the programming current $I_w$ is arbitrary. By applying a magnetic field having the reverse orientation of the orientation of the magnetization 40m of the fourth ferromagnetic layer 40, the orientation of the rotating magnetic field generated by the third ferromagnetic layer 30 and the orientation of the precession of the magnetization 20m of the second ferromagnetic layer 20 can be caused to match each other.

For the stacking orders of the magnetic memory element 110 and the magnetic memory element 111, for example, compared to a configuration in which the fourth ferromagnetic layer 40 is disposed between the second ferromagnetic layer 20 and the third ferromagnetic layer 30, etc., the distance between the second ferromagnetic layer 20 and the third ferromagnetic layer 30 is short. Thereby, the rotating magnetic field generated by the third ferromagnetic layer 30 can be caused to act on the second ferromagnetic layer 20 more appropriately. The magnetization reversal of the second ferromagnetic layer 20 can be assisted more efficiently.

Figure 9:
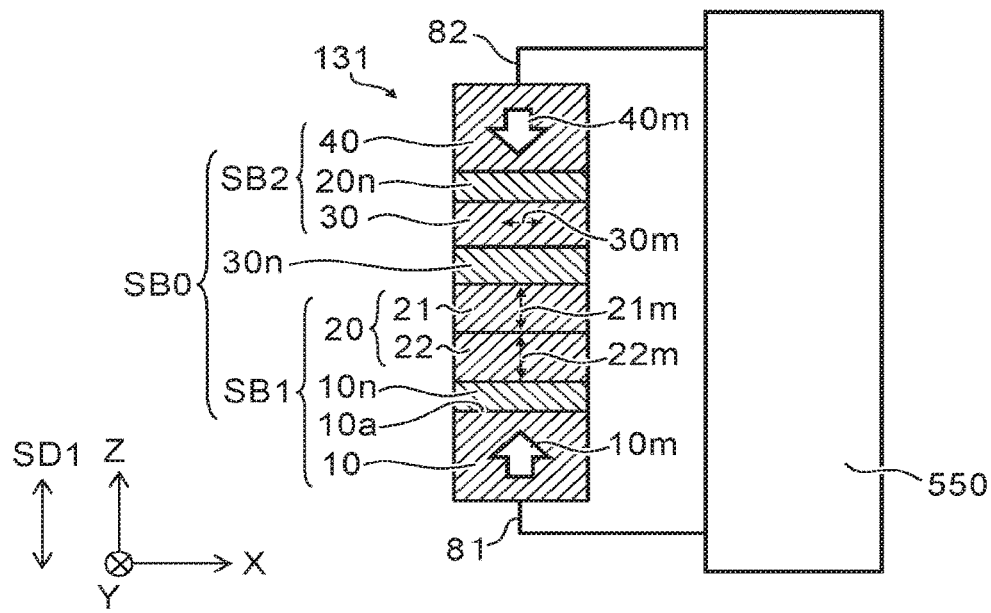
FIG. 9 is a schematic cross-sectional view showing a magnetic memory element according to the first embodiment.

FIG. 9 is a schematic cross-sectional view showing a magnetic memory element according to the first embodiment.

As shown in FIG. 9, the second ferromagnetic layer 20 of the magnetic memory element 131 includes a first portion 21 and a second portion 22. Otherwise, the configuration described in regard to the magnetic memory element 110 is applicable to the magnetic memory element 131.

The direction of a magnetization 21m of the first portion 21 is changeable. The second portion 22 is stacked with the first portion 21 in the stacking direction SD1 of the first ferromagnetic layer 10 and the second ferromagnetic layer 20. In the example, the second portion 22 is provided between the first ferromagnetic layer 10 and the first portion 21. The first portion 21 may be provided between the first ferromagnetic layer 10 and the second portion 22. The direction of a magnetization 22m of the second portion 22 is changeable. The magnetization 21m of the first portion 21 has ferromagnetic coupling or magnetostatic coupling with the magnetization 22m of the second portion 22. The magnetic resonance frequency of the second portion 22 is lower than the magnetic resonance frequency of the first portion 21. The magnetic resonance frequency of the first portion 21 is, for example, 20 GHz or more. The magnetic resonance frequency of the second portion 22 is, for example, less than 20 GHz.

The first portion 21 and the second portion 22 include, for example, alloys. The concentration of at least one element included in the second portion 22 is different from the concentration of the same element included in the first portion 21. In other words, the composition ratio of the alloy included in the second portion 22 is different from the composition ratio of the alloy included in the first portion 21.

The second portion 22 is, for example, the portion of the second ferromagnetic layer 20 having a composition ratio of the alloy different from that of the first portion 21.

The material of the second portion 22 may be different from the material of the first portion 21. In such a case, the first portion 21 and the second portion 22 each can be considered to be one layer included in the second ferromagnetic layer 20. In other words, the second ferromagnetic layer 20 may be a stacked structure including the first layer and the second layer.

In the magnetic memory element 131, the magnetization 21m of the first portion 21 and the magnetization 22m of the second portion 22 have ferromagnetic coupling or magnetostatic coupling. Thereby, for example, the $\Delta$ value, i.e., the thermal agitation resistance, of the second ferromagnetic layer 20 in the magnetostatic state can be increased. Accordingly, misoperations of the magnetic memory element 110 and the memory device 610 can be suppressed. For example, the memory retention time of the magnetic memory element 110 can be increased.

For example, the $\Delta$ value is the ratio of the thermal energy and the magnetic anisotropy energy of the second ferromagnetic layer 20. For example, the $\Delta$ value may be expressed by the following formula.

$$\Delta = Ku \cdot V / K_B \cdot T.$$

In the formula recited above, Ku is the effective magnetic anisotropy constant; V is the volume of the second ferromagnetic layer 20; $K_B$ is the Boltzmann constant; and T is the absolute temperature of the magnetic memory element 131.

In the magnetic memory element 131, the spin-polarized electrons are caused to act on the second ferromagnetic layer 20 by causing the current to flow in the first stacked member SB1 and the second stacked member SB2 in the stacking direction SD1. In the magnetic memory element 131, the rotating magnetic field that is generated by causing the magnetization of the third ferromagnetic layer 30 to precess is caused to act on the second ferromagnetic layer 20. Thereby, the direction of the magnetization 21m of the first portion 21 and the direction of the magnetization 22m of the second portion 22 of the second ferromagnetic layer 20 are determined to be in a direction corresponding to the orientation of the current.

In the first portion 21 of the second ferromagnetic layer 20, for example, the direction of the magnetization 21m of the first portion 21 is a direction substantially perpendicular to the film surface and substantially parallel to the stacking direction SD1. The magnetization 21m of the first portion 21 is reversible. The first portion 21 performs the role of storing data. For example, the first portion 21 functions as a magnetic memory layer.

In the second portion 22 of the second ferromagnetic layer 20, for example, the direction of the magnetization 22m of the second portion 22 is a direction substantially perpendicular to the film surface and substantially parallel to the stacking direction SD1. The magnetization 22m of the second portion 22 is reversible. For example, the magnetization reversal of the magnetization 22m of the second portion 22 occurs earlier than that of the magnetization 21m of the first portion 21 when the current flows in the stacked structure SB0 in the stacking direction SD1; and the magnetization 22m of the second portion 22 assists the magnetization reversal of the magnetization 21m of the first portion 21. For example, the second portion 22 functions as a trigger of the magnetization reversal of the first portion 21. For example, the second portion 22 is called a trigger layer.

The second portion 22 also contributes to the memory retention of the data. Accordingly, the second ferromagnetic layer 20 may be considered to be the magnetic memory layer; the first portion 21 may be considered to be the main body portion of the memory retention; and the second portion 22 may be considered to be the trigger portion of the magnetization reversal.

For example, the width (the diameter) of the magnetic memory element 131 is set to be 30 nm or less. Thereby, the bit density of MRAM can be increased. In such a case, when the Δ value (the thermal stability constant) described above is small, there are cases where the magnetic memory element 131 cannot continue to retain the programmed data. For example, the effective magnetic anisotropy constant Ku is set to be large to set the Δ value to be large. When the effective magnetic anisotropy constant Ku is large, for example, an effective magnetic anisotropy magnetic field Hk also is large. Thereby, the programming current may undesirably be large; and the resonance frequency may undesirably be high.

Conversely, in the magnetic memory element 131, the magnetic resonance frequency of the second ferromagnetic layer 20 is reduced by the second portion 22. Therefore, the magnetization 21$m$ of the first portion 21 and the magnetization 22$m$ of the second portion 22 can be reversed by applying a magnetic field of a frequency corresponding to the reduced magnetic resonance frequency of the second ferromagnetic layer 20. In such a case, the reversal can be performed using a current smaller than the case where the first portion 21 is solitary or the case where the magnetic field corresponding to the magnetic resonance frequency is not applied. For example, the magnetic resonance frequency of the second portion 22 is less than 20 GHz, and more favorably 15 GHz or less. Accordingly, for example, the frequency of the rotating magnetic field generated by the third ferromagnetic layer 30 can be set to be less than 20 GHz. Thereby, for example, it is easy to match the frequency of the rotating magnetic field generated by the third ferromagnetic layer 30 and the magnetic resonance frequencies of the magnetization 21$m$ and the magnetization 22$m$. For example, in the magnetic memory element 110, the degrees of freedom of the design of the first stacked member SB1 and the second stacked member SB2 can be increased.

The second portion 22 may include, for example, a Heusler alloy. For example, the second portion 22 may include a Heusler alloy including at least one selected from the group consisting of Co, Mn, Fe, Ni, Cu, Rh, Ru, and Pd. For example, the Heusler alloy may include at least one selected from the group consisting of $Co_2MnGa$, $Co_2MnAl$, $Ni_2MnIn$, $Ni_2MnGa$, $Ni_2MnSn$, $Pd_2MnSb$, $Pd_2MnSn$, $Cu_2MnAl$, $Cu_2MnSn$, $Cu_2MnIn$, $Rh_2MnGe$, and $Rh_2MnPb$.

For example, the spin injection efficiency g(8) of the Heusler alloy is high; and a low resonance frequency can be obtained. Thereby, for example, the reversal current of the magnetization of the second ferromagnetic layer 20 can be reduced.

For example, the magnetization Ms is relatively small for such Heusler alloys. For example, the magnetization Ms is 800 emu/cc or less. Thereby, the leakage magnetic field that is generated by the magnetization of the second portion 22 including the Heusler alloy can be suppressed.

Figure 10:
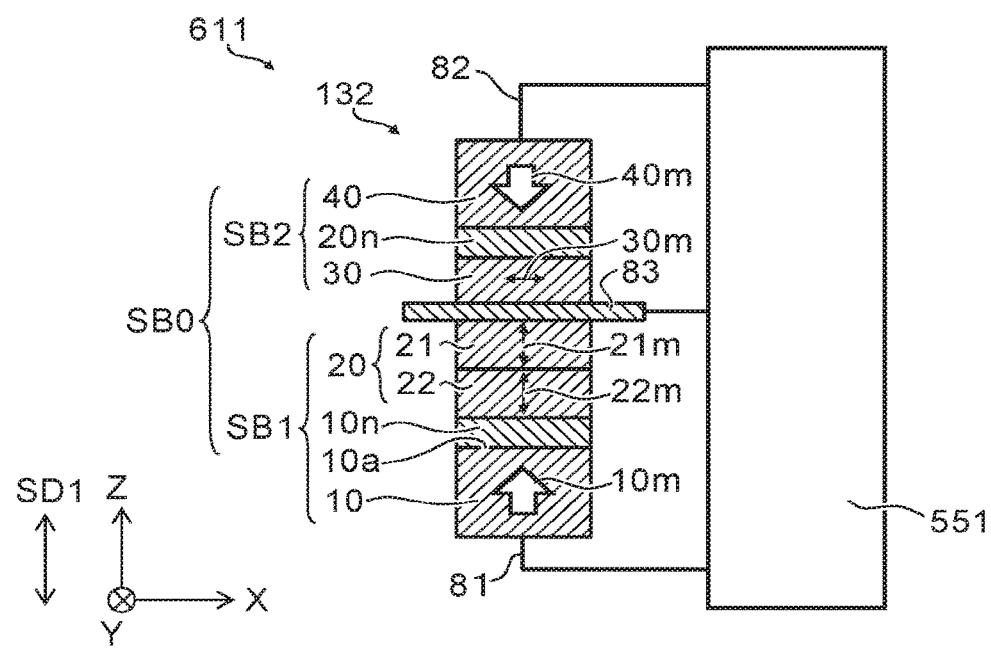
FIG. 10 is a schematic cross-sectional view showing a memory device according to the first embodiment.

FIG. 10 is a schematic cross-sectional view illustrating a memory device according to the first embodiment.

As shown in FIG. 10, the memory device 611 includes a magnetic memory element 132 and a controller 551.

The magnetic memory element 132 includes an intermediate interconnect 83. The intermediate interconnect 83 is provided between the first stacked member SB1 and the second stacked member SB2. The first stacked member SB1 is provided between the first conductive layer 81 and the intermediate interconnect 83. The second stacked member SB2 is provided between the second conductive layer 82 and the intermediate interconnect 83. The controller 551 is electrically connected to the magnetic memory element 132. The controller 551 can apply the voltage to the magnetic memory element 132 and supply the current to the magnetic memory element 132 via the first conductive layer 81, the second conductive layer 82, and the intermediate interconnect 83. Otherwise, a configuration similar to the configuration described in regard to the memory device 610 is applicable to the memory device 611.

The intermediate interconnect 83 is provided in the magnetic memory element 132. Thereby, for example, a current $I_{MTJ}$ that flows in the first stacked member SB1 via the first conductive layer 81 (the first interconnect 91) and the intermediate interconnect 83 and a current $I_{STO}$ that flows in the second stacked member SB2 via the second conductive layer 82 (the second interconnect 92) and the intermediate interconnect 83 can be controlled independently.

In the example, the second ferromagnetic layer 20 includes the first portion 21 (the trigger layer) and the second portion 22. Such a trigger layer may or may not be provided. In the case where the trigger layer is provided, for example, the magnetic resonance frequency of the second ferromagnetic layer 20 is low. Thereby, the frequency of the magnetic field generated by the STO can be set to be low. The magnetic memory element can be made more easily.

Figure 11A:
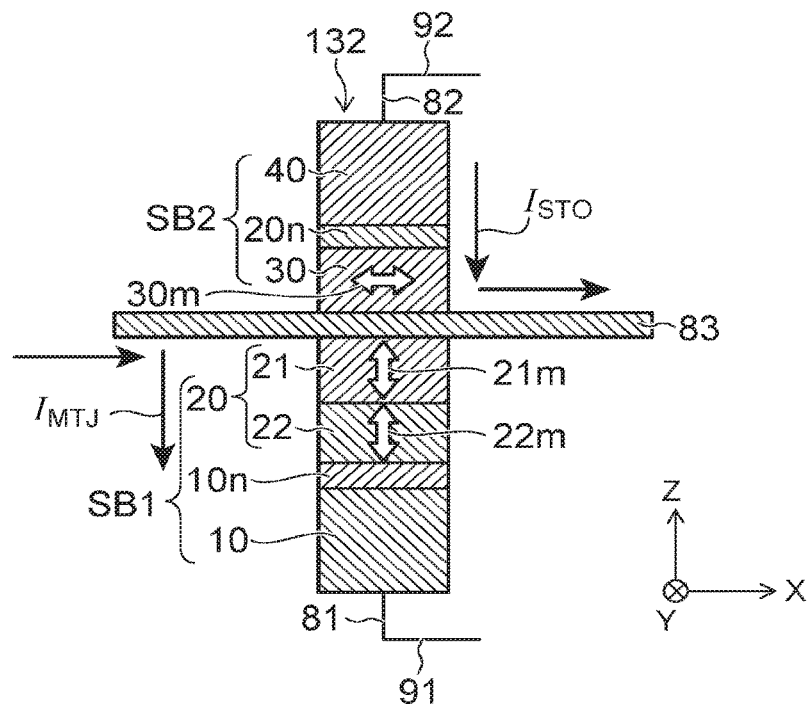
FIG. 11A and FIG. 11B are schematic views showing operations of the memory device according to the first embodiment.
Figure 11B:
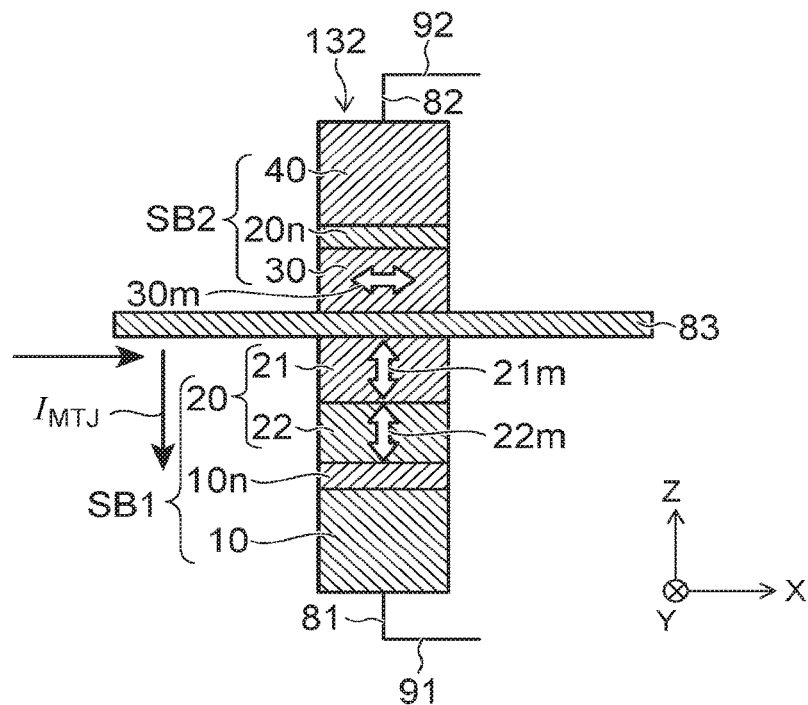

FIG. 11A and FIG. 11B are schematic views illustrating operations of the memory device according to the first embodiment.

FIG. 11A shows the operation of programming the magnetic memory element 132. For example, the controller 551 causes a current to flow between the intermediate interconnect 83 and the second interconnect 92 (and the second conductive layer 82). Thus, the current $I_{STO}$ is caused to flow in the second stacked member SB2; and the magnetization 30$m$ of the third ferromagnetic layer 30 is caused to precess.

In the magnetic memory element 132 according to the embodiment, a memory layer is stacked with a magnetic field generation layer in which the slope of the oscillation characteristic is large. Thereby, for example, even in the case where the action of the spin-polarized electrons generated by the current $I_{MTJ}$ flowing in the first stacked member SB1 is small, the magnetization 20$m$ can be reversed by the action of the rotating magnetic field generated by the precession of the magnetization 30$m$. In other words, in the operation of programming the magnetic memory element 132, the magnitude of the current $I_{MTJ}$ flowing in the first stacked member SB1 can be small (e.g., zero). For example, the programming can be performed using only the current $I_{STO}$ flowing in the second stacked member SB2.

In the programming operation, the current $I_{STO}$ (the programming current) that flows in the second stacked member SB2 is larger than the current $I_{MTJ}$ flowing in the first stacked member SB1. Or, the current $I_{MTJ}$ is not caused to flow in the first stacked member SB1.

FIG. 11B shows the operation of reading the magnetic memory element 132. For example, the controller 551 causes a current to flow between the intermediate interconnect 83 and the first interconnect 91 (and the first conductive layer 81). Thus, the reading can be performed by the current $I_{MTJ}$ flowing in the first stacked member SB1. For example, the electrical resistance that changes due to the magnetoresistance effect between the first ferromagnetic layer 10 and the second ferromagnetic layer 20 is read. At this time, the magnitude of the current $I_{STO}$ flowing in the second stacked member SB2 can be set to be small (e.g., zero).

In the read-out operation, the current $I_{STO}$ that flows in the second stacked member SB2 is smaller than the current $I_{MTJ}$ flowing in the first stacked member SB1. Or, the current $I_{MTJ}$ is not caused to flow in the second stacked member SB2.

For example, by not applying the voltage to the second stacked member SB2, the rotating magnetic field is not generated by the precession of the magnetization 30m in the operation of reading. The reversal of the magnetization 20m when reading can be suppressed. In other words, by not causing the current to flow in the magnetic field generation layer, the reversal current at which misprogramming of the memory layer occurs can be set to be large. Thereby, the misprogramming can be suppressed.

The orientation of the current $I_{MTJ}$ and the orientation of the current $I_{STO}$ respectively may be the reverse orientations of the orientations shown in FIG. 11A and FIG. 11B.

In the operation of programming, for example, a voltage is applicable between the first conductive layer 81 and the intermediate interconnect 83 without applying a voltage between the second conductive layer 82 and the intermediate interconnect 83. In such a case, the current $I_{STO}$ that flows through the second stacked member SB2 can be reduced.

Figure 12:
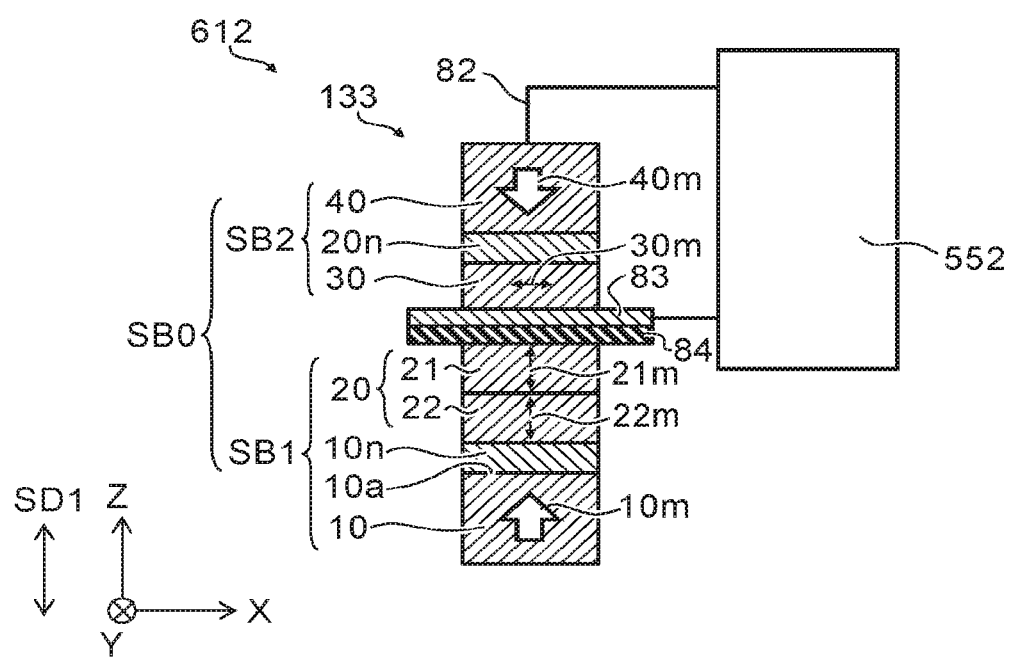
FIG. 12 is a schematic cross-sectional view showing a memory device according to the first embodiment.

FIG. 12 is a schematic cross-sectional view illustrating a memory device according to the first embodiment.

As shown in FIG. 12, the memory device 612 includes a magnetic memory element 133 and a controller 552.

The controller 552 is electrically connected to the magnetic memory element 133. The controller 552 applies a voltage and supplies a current to the second stacked member SB2 via the second conductive layer 82 and the intermediate interconnect 83. The first conductive layer 81 and the first interconnect 91 are not provided in the memory device 612. The first conductive layer 81 and the first interconnect 91 may be provided as necessary. In the example, the magnetic memory element 133 includes an insulating layer 84. The insulating layer 84 is provided between the intermediate interconnect 83 and the first stacked member SB1. For example, the insulating layer 84 may not be provided. Otherwise, a configuration similar to the configuration described in regard to the memory device 611 is applicable to the memory device 612.

Figure 13A:
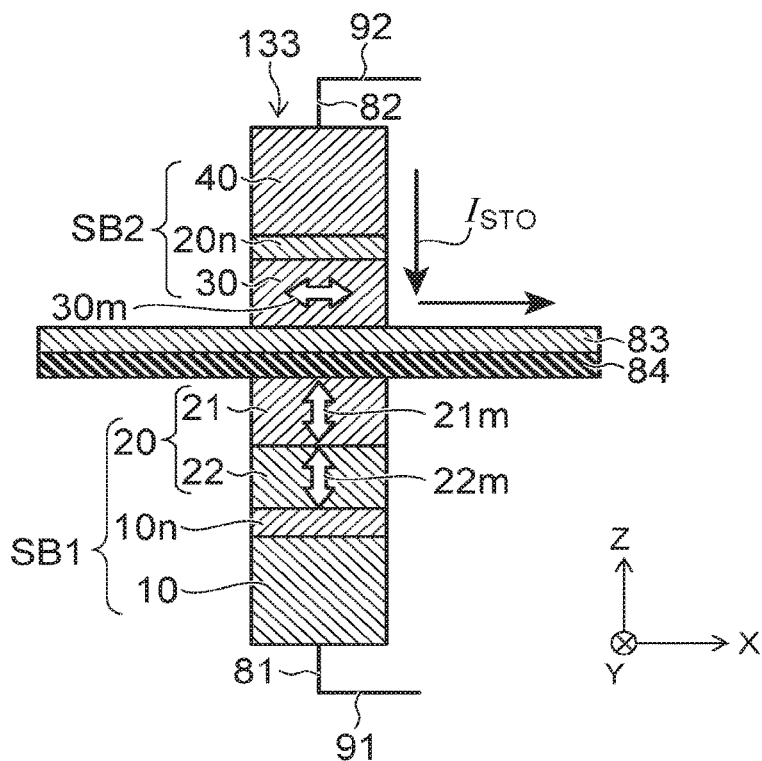
FIG. 13A and FIG. 13B are schematic views showing operations of the memory device according to the first embodiment.
Figure 13B:
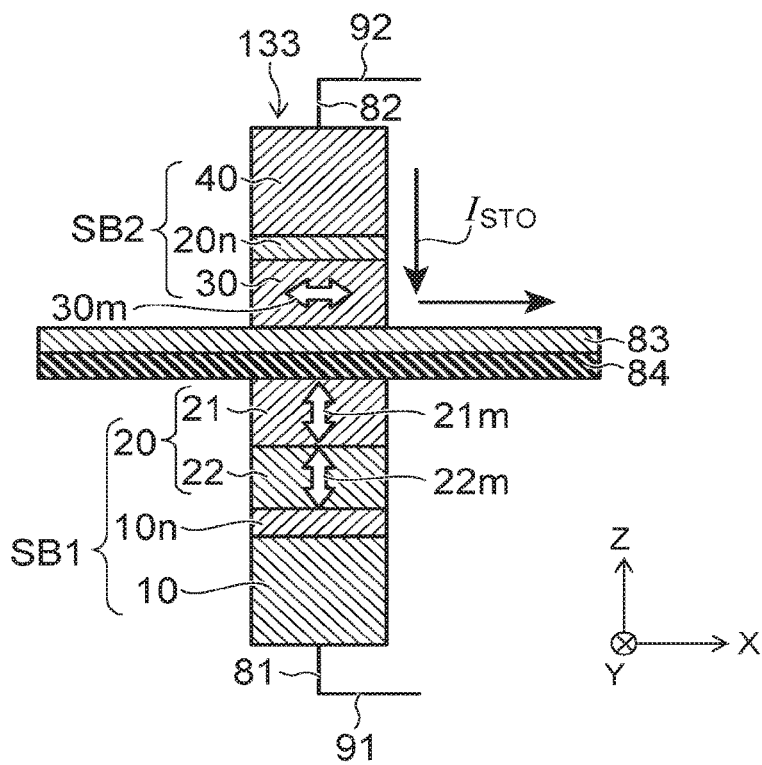

FIG. 13A and FIG. 13B are schematic views illustrating operations of the memory device according to the first embodiment.

FIG. 13A shows the operation of programming the magnetic memory element 133.

In the magnetic memory element 133, the memory layer and the magnetic field generation layer have magnetostatic coupling. The memory layer is stacked with the magnetic field generation layer in which the slope of the oscillation characteristic is large. Thereby, the programming can be performed using only the current $I_{STO}$ flowing in the second stacked member SB2. In the programming operation, the controller 552 causes the current to flow between the intermediate interconnect 83 and the second interconnect 92 (and the second conductive layer 82). The current $I_{STO}$ that flows in the second stacked member SB2 is larger than the current $I_{MTJ}$ flowing in the first stacked member SB1. By providing the insulating layer 84, the magnitude of the current flowing in the first stacked member SB1 can be substantially zero. For example, the current $I_{MTJ}$ is not caused to flow in the first stacked member SB1. Thereby, failures due to breakdown of the insulating film (the first nonmagnetic layer 10n) of the MTJ due to the applied voltage can be suppressed.

FIG. 13B shows the operation of reading the magnetic memory element 133. In the read-out operation, the controller 552 causes a current to flow between the intermediate interconnect 83 and the second interconnect 92 (and the second conductive layer 82). The direction of the magnetization 20m of the second ferromagnetic layer 20 can be sensed by using the current $I_{STO}$ flowing through the second stacked member SB2.

In the operation of reading the magnetic memory element 133, the current $I_{STO}$ that flows in the second stacked member SB2 is larger than the current $I_{MTJ}$ flowing in the first stacked member SB1. For example, the current $I_{MTJ}$ is not caused to flow in the first stacked member SB1. By providing the insulating layer 84, the magnitude of the current flowing in the first stacked member SB1 can be substantially zero.

The magnitude of the effective magnetic field applied to the third ferromagnetic layer 30 changes according to the direction of the magnetization 20m of the second ferromagnetic layer 20. Thereby, for example, the oscillation frequency of the rotating magnetic field generated by the third ferromagnetic layer 30 is dependent on the direction of the magnetization 20m of the second ferromagnetic layer 20. For example, the magnitude of the current (the threshold current of the oscillation) causing the third ferromagnetic layer 30 to generate the rotating magnetic field is dependent on the direction of the magnetization 20m. For example, the direction of the magnetization 20m can be sensed from the oscillation characteristic using such an oscillation frequency or threshold.

Thus, in the magnetic memory element 133, the programming operation and the read-out operation can be performed without causing a current to flow in the first stacked member SB1. Thereby, failures due to breakdown of the insulating film (the first nonmagnetic layer 10n) of the MTJ due to the applied voltage can be suppressed.

FIG. 14A to FIG. 14E are schematic views showing characteristics of memory devices.

Figure 14A:
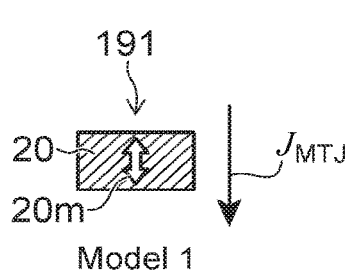
FIG. 14A to FIG. 14E are schematic views showing characteristics of memory devices.

FIG. 14A shows a magnetic memory element 191 of a reference example (Model 1). The second stacked member SB2 is not provided in the magnetic memory element 191. Otherwise, the configuration of the magnetic memory element 191 is similar to that of the magnetic memory element 110.

Figure 14B:
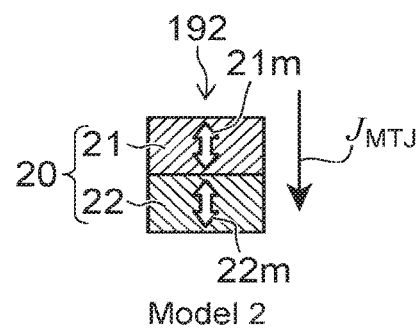

FIG. 14B shows a magnetic memory element 192 of a reference example (Model 2). The second stacked member SB2 is not provided in the magnetic memory element 192. In the magnetic memory element 192, the second ferromagnetic layer 20 includes the first portion 21 (the trigger layer) and the second portion 22 (the memory layer). Otherwise, the configuration of the magnetic memory element 192 is similar to that of the magnetic memory element 191.

Figure 14C:
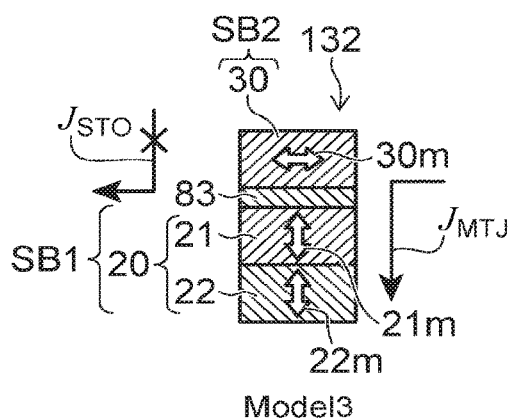
Figure 14D:
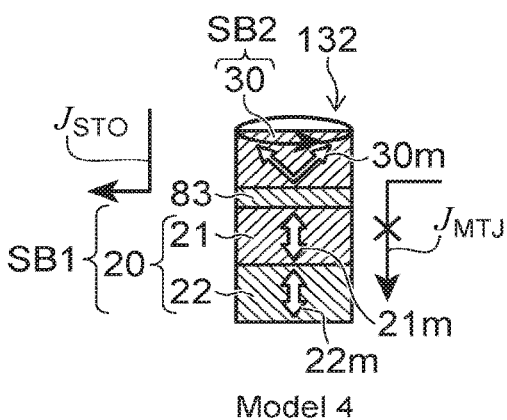

FIG. 14C and FIG. 14D show a magnetic memory element 132 according to the embodiment. FIG. 14C shows a first programming operation of the magnetic memory element 132 (Model 3). In Model 3, the current that flows in the third ferromagnetic layer 30 is set to be small; and a current $J_{MTJ}$ is caused to flow in the first stacked member SB1. FIG. 14D shows a second programming operation of the magnetic memory element 132 (Model 4). In Model 4, the current $J_{MTJ}$ that flows in the first stacked member SB1 is set to be small; and a current $J_{STO}$ is caused to flow in the second stacked member SB2.

In FIG. 14A to FIG. 14D, portions (the first ferromagnetic layer 10, the first nonmagnetic layer 10n, the fourth ferromagnetic layer 40, the first conductive layer 81, the second conductive layer 82, etc.) of the magnetic memory element are not shown for easier viewing of the drawings.

Figure 14E:
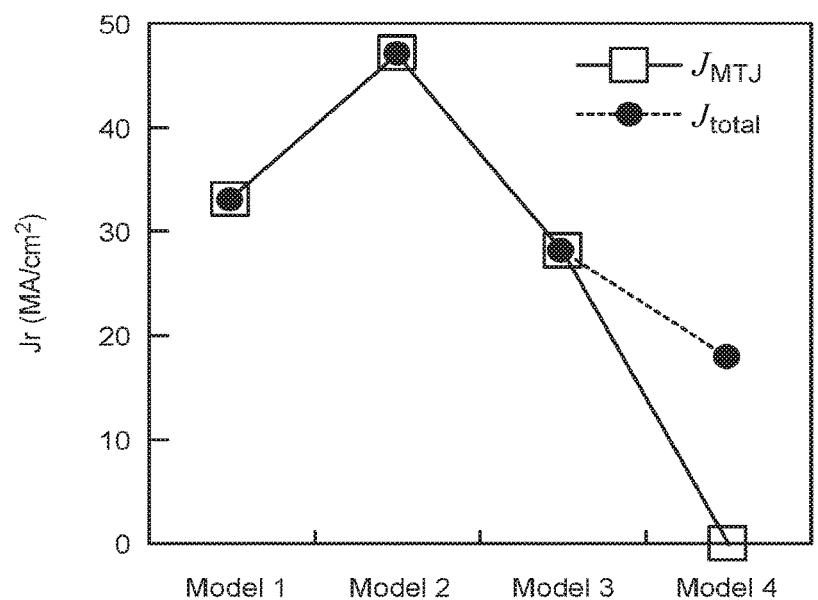

FIG. 14E is the simulation results of the calculation of the current (the reversal current) that causes the magnetization 20m of the second ferromagnetic layer 20 to reverse for the magnetic memory elements 191, 192, and 132. The vertical axis of FIG. 14E is a reversal current Jr (MA/cm$^2$). In FIG. 14E, a current $J_{total}$ that flows in the magnetic memory element in the programming operation is illustrated by the black circles; and the current $J_{MTJ}$ that flows in the first stacked member in the programming operation is illustrated by the white squares. In the simulation, a pulse current of 3 ns is injected for each of the magnetic memory elements. For example, the diameter of the magnetic memory element is 16 nm.

In Model 1 as shown in FIG. 14E, the reversal current Jr of the magnetic memory element 191 is about 32 (MA/cm$^2$).

In Model 2, the reversal current Jr of the magnetic memory element 192 is about 48 (MA/cm$^2$).

In the first programming operation of the magnetic memory element 132 (Model 3), the reversal current Jr is about 28 (MA/cm$^2$). In the magnetic memory elements 191, 192, and 132 of the example, the current $J_{MTJ}$ and the current $J_{total}$ are substantially equal to each other.

On the other hand, in the second programming operation of the magnetic memory element 132 (Model 4), the result of the magnetization 20m reversing is obtained even when a current substantially does not flow in the first stacked member SB1. In such a case, the current $J_{STO}$ that flows in the second stacked member SB2 is about 18 (MA/cm$^2$); and the current $J_{MTJ}$ that flows in the first stacked member SB1 is about 0 (MA/cm$^2$).

For example, in the magnetic memory element 132, the read-out operation can be performed by causing a current of about 3 (MA/cm$^2$) to flow in the first stacked member SB1.

As in the magnetic memory element 132 according to the embodiment, the programming can be performed without causing a current to flow in the MTJ by providing the second ferromagnetic layer 20 and the third ferromagnetic layer 30 with magnetostatic coupling.

Figure 15:
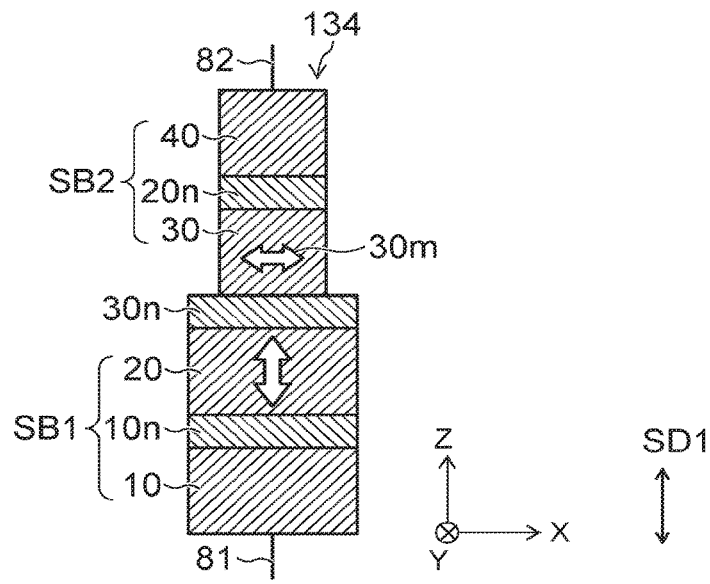
FIG. 15 is a schematic cross-sectional view showing a magnetic memory element according to the first embodiment.

FIG. 15 is a schematic cross-sectional view showing a magnetic memory element according to the first embodiment.

In the magnetic memory element 134 according to the embodiment as shown in FIG. 15, the width (the cross-sectional configuration when cut by a plane perpendicular to the stacking direction SD1) of the first stacked member SB1 is different from the width of the second stacked member SB2. Otherwise, a configuration similar to that of the magnetic memory element 110 is applicable to the magnetic memory element 134.

For example, the cross-sectional area (a first surface area S1) of the first stacked member SB1 when cut by a plane perpendicular to the stacking direction SD1 is greater than the cross-sectional area (a second surface area S2) of the second stacked member SB2 when cut by a plane perpendicular to the stacking direction SD1.

Thereby, for example, the current density of the second stacked member SB2 can be set to be larger than the current density of the first stacked member SB1 when a current is caused to flow in the stacked structure SB0 via the first conductive layer 81 and the second conductive layer 82. The current density of the magnetic field generation layer (the third ferromagnetic layer 30) can be set to be large.

By setting the current density of the magnetic field generation layer to be large, for example, the magnetization 30m of the third ferromagnetic layer 30 can be caused to oscillate (precess) using a smaller current. In other words, the magnetization 30m can be caused to oscillate at the first frequency f1 (the magnetic resonance frequency of the second ferromagnetic layer 20) by a smaller current. Thereby, for example, the current that is caused to flow in the MTJ in the programming operation can be reduced.

For example, it is desirable for the width (the length along the X-axis direction) of the second stacked member SB2 to be 25 nm or less. For example, it is desirable for the first surface area S1 of the first stacked member SB1 to be not less than 2.0 times the second surface area S2 of the second stacked member SB2.

Figure 16:
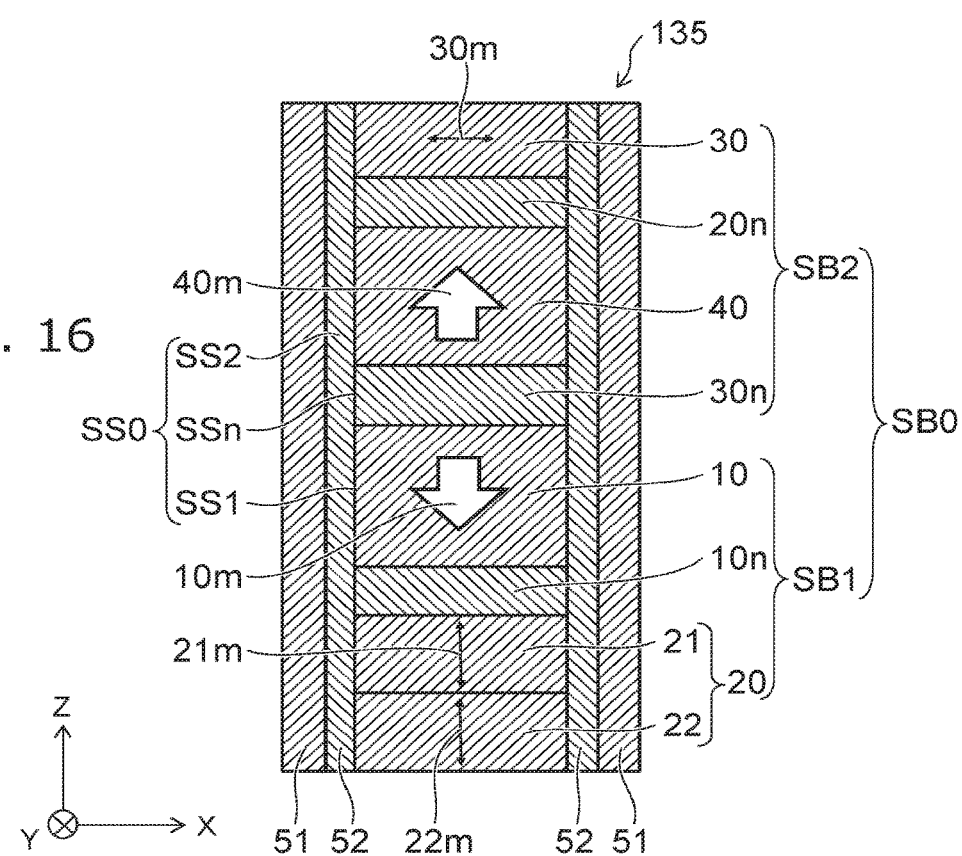
FIG. 16 is a schematic cross-sectional view showing a magnetic memory element according to the first embodiment.

FIG. 16 is a schematic cross-sectional view illustrating a magnetic memory element according to the first embodiment.

As shown in FIG. 16, the magnetic memory element 135 further includes the magnetic shield 51. The stacked structure SB0 has a side surface SS0 extending in the stacking direction SD1. The first stacked member SB1 has a side surface SS1 (a first side surface) extending in the stacking direction SD1. The second stacked member SB2 has a side surface SS2 (a second side surface) extending in the stacking direction SD1. The third nonmagnetic layer 30n has a side surface SSn extending in the stacking direction SD1. Here, "extending in the stacking direction SD1" includes states non-parallel to the stacking direction SD1. To "extend in the stacking direction SD1," it is sufficient to have at least a component extending in the stacking direction SD1. In other words, a surface is a "surface extending in the stacking direction SD1" if the surface is not orthogonal to the stacking direction SD1.

The magnetic shield 51 covers at least a portion of the side surface SS0 of the stacked structure SB0. In other words, the magnetic shield 51 opposes at least a portion of the side surface SS0 of the stacked structure SB0. For example, the side surface SS0 of the stacked structure SB0 includes the side surface SS1 (the first side surface) of the first stacked member SB1, the side surface SS2 (the second side surface) of the second stacked member SB2, and the side surface SSn of the third nonmagnetic layer 30n. In the example, the magnetic shield 51 covers the side surface SS1, the side surface SS2, and the side surface SSn. The configuration of the magnetic shield 51 projected onto the X-Y plane is, for example, an annular configuration provided around the stacked structure SB0.

The magnetic memory element 135 further includes a protective layer 52 provided between the magnetic shield 51 and the side surface SS0 of the stacked structure SB0. It is desirable for the thickness of the protective layer 52 to be substantially the same length as, or longer than, the distance in the Z-axis direction from the Z-axis direction center of the second ferromagnetic layer 20 to the Z-axis direction center of the third ferromagnetic layer 30. The distance in the Z-axis direction between the Z-axis direction center of the second ferromagnetic layer 20 and the Z-axis direction center of the third ferromagnetic layer 30 is, for example, shortest for the configuration of the magnetic memory element 110 and the configuration of the magnetic memory element 111 and longest for the configurations of the magnetic memory elements 121 to 126. For example, it is desirable for the thickness of the protective layer 52 to be not less than 2 nm and not more than 30 nm.

For example, the side surface SS1 of the first stacked member SB1 and the side surface SS2 of the second stacked member SB2 are covered with the magnetic shield 51 of permalloy (Py), etc., with the protective layer 52 of SiN, Al$_2$O$_3$, etc., interposed. Thereby, for example, in the case where multiple magnetic memory elements 135 are arranged, negative effects of the leakage magnetic field from the adjacent magnetic memory element 135 on the operations of the first stacked member SB1 and the second stacked member SB2 are suppressed. For example, the fluctuation of the reversal current between the bits is suppressed because the effective magnetic field that acts on the first stacked member SB1 is substantially the same between each of the memory cells (stacked bodies SB0). The fluctuation of the generation current is suppressed similarly for the second stacked member SB2 as well. Also, the leakage magnetic fields from the first stacked member SB1 and the second stacked member SB2 that act on the adjacent magnetic memory element can be suppressed. As a result, the multiple magnetic memory elements can be disposed to be proximal to each other; and the bit density can be increased. For example, the bit density of the memory device can be increased.

The magnetic shield 51 includes, for example, one metal selected from the group consisting of iron (Fe), cobalt (Co), nickel (Ni), manganese (Mn), and chrome (Cr), or an alloy including at least two metals selected from the group. The magnetic shield 51 may be, for example, an alloy including at least one metal selected from the group consisting of iron (Fe), cobalt (Co), nickel (Ni), manganese (Mn), and chrome (Cr) and at least one metal selected from the group consisting of platinum (Pt), palladium (Pd), iridium (Ir), ruthenium (Ru), and rhodium (Rh).

The characteristics of the magnetic shield 51 can be adjusted by adjusting the composition of the magnetic material included in the magnetic shield 51 and the conditions of the heat treatment of the magnetic shield 51. The magnetic shield 51 may be, for example, a rare earth-transition metal amorphous alloy such as TbFeCo, GdFeCo, etc. The magnetic shield 51 may have a stacked structure of Co/Pt, Co/Pd, Co/Ni, etc.

The protective layer 52 may include, for example, an oxide, a nitride, or a fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe). The protective layer 52 includes, for example, SiN.

An example of the method for manufacturing the magnetic memory element 135 shown in FIG. 16 will now be described.

After forming a lower electrode (not shown) on a wafer, the wafer is disposed inside an ultra high vacuum sputtering apparatus. Ta/Ru (a stopper layer/contact layer for the lower electrode), an FePt layer/CoFeB (the first ferromagnetic layer 10), MgO (the first nonmagnetic layer 10n), a CoFeB layer (a memory layer), and a Ru layer (the third nonmagnetic layer 30n) are stacked in this order on the lower electrode. Here, it is also possible to adjust the strength of the magnetic anisotropy in the direction perpendicular to the film surface between the CoFeB and the FePt layer/CoFeB by annealing in a magnetic field. Continuing, a Py layer/Cu/CoFeB/FePt layer (a magnetic field generator) and a Ru/Ta layer (an upper contact layer) are stacked in this order. Thereby, a patterning body is formed.

Then, a resist mask having a diameter of 30 nm is formed by coating an EB resist and performing EB exposure. The portion that is not covered with the resist is cut away by ion milling until the Ta layer on the stopper layer/lower electrode is exposed.

Continuing, after forming a SiN layer as the protective layer 52, a Py layer that functions as the magnetic shield 51 is formed. Etch-back is performed so that the Py layer remains on the side wall of the magnetic memory element.

Then, a SiO$_2$ film is formed to insulate and bury the magnetic memory element; subsequently, planarizing by CMP, etc., is performed; and subsequently, the contact layer for the electrode is exposed by etching the entire surface by RIE, etc.

A resist is coated onto the entire surface; and the resist is patterned using a stepper lithography apparatus so that the portion at the position of the upper electrode is not covered with the resist. Cu is formed as a film and filled into the opening corresponding to the upper electrode; and the resist is removed. The electrical input and output are possible by providing a not-shown interconnect for the upper electrode.

Thereby, the magnetic memory element 135 is completed.

Second Embodiment

Figure 17:
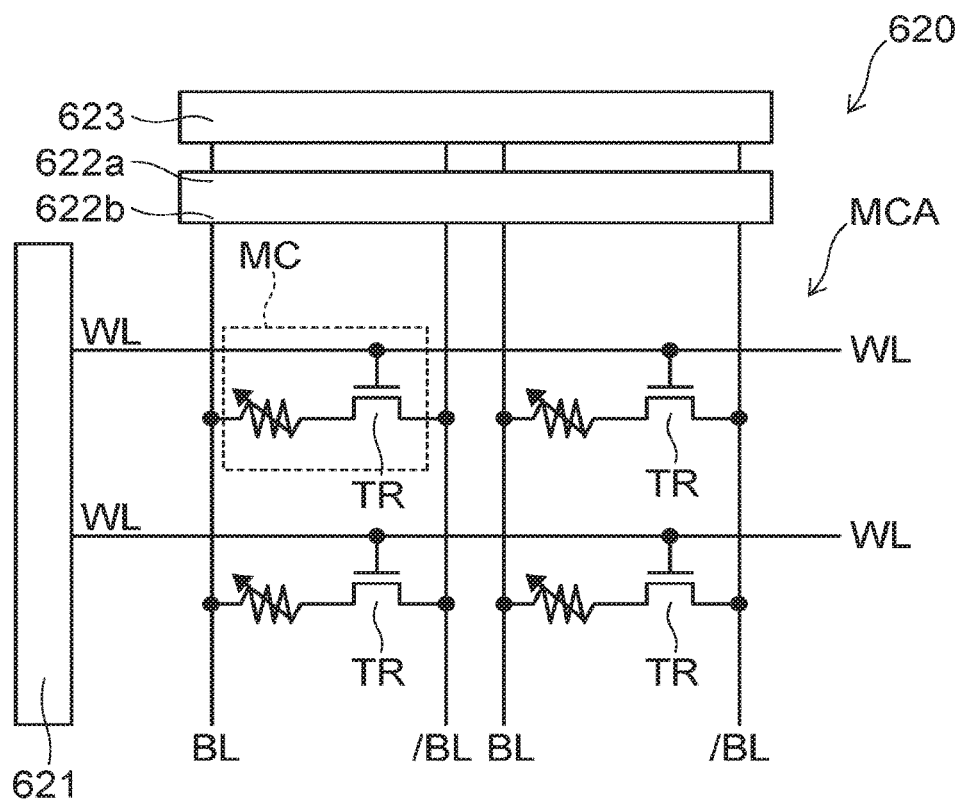
FIG. 17 is a schematic view showing a memory device according to a second embodiment.

FIG. 17 is a schematic view illustrating a memory device according to a second embodiment.

As shown in FIG. 17, the memory device 620 according to the embodiment includes a memory cell array MCA. The memory cell array MCA includes multiple memory cells MC arranged in a matrix configuration. Each of the memory cells MC includes one of the magnetic memory elements according to the first embodiment as a MTJ element (the stacked structure SB0).

Multiple bit line pairs (a bit line BL and a bit line /BL) and multiple word lines WL are disposed in the memory cell array MCA. Each of the multiple bit line pairs extends in a column direction. Each of the multiple word lines WL extends in a row direction.

The memory cells MC are disposed at the intersections between the bit lines BL and the word lines WL. Each of the memory cells MC includes the MTJ element and a selection transistor TR. One end of the MTJ element is connected to the bit line BL. The other end of the MTJ element is connected to the drain terminal of the selection transistor TR. The gate terminal of the selection transistor TR is connected to the word line WL. The source terminal of the selection transistor TR is connected to the bit line /BL.

A row decoder 621 is connected to the word lines WL. A program circuit 622a and a read-out circuit 622b are connected to the bit line pairs (the bit lines BL and the bit lines /BL). A column decoder 623 is connected to the program circuit 622a and the read-out circuit 622b.

Each of the memory cells MC is selected by the row decoder 621 and the column decoder 623. An example of the data programming to the memory cell MC is as follows. First, the word line WL that is connected to the memory cell MC for which the data programming is to be performed is activated to select the memory cell MC. Thereby, the selection transistor TR is switched ON.

In the example, for example, the controller 550 includes the row decoder 621, the program circuit 622a, the read-out circuit 622b, and the column decoder 623. The controller 550 is electrically connected to each of the multiple memory cells MC (the multiple magnetic memory elements) via the bit line BL, the word line WL, the selection transistor TR, etc. The controller 550 implements the programming of the data and the reading of the data to and from each of the multiple memory cells MC.

For example, a bidirectional programming current is supplied to the MTJ element. Specifically, in the case where the programming current is supplied to the MTJ element from left to right, the program circuit 622a applies a positive potential to the bit line BL and applies the ground potential to the bit line /BL. In the case where the programming current is supplied to the MTJ element from right to left, the program circuit 622a applies a positive potential to the bit line /BL and applies the ground potential to the bit line BL. Thus, the datum of "0" or the datum of "1" can be programmed to the memory cell MC.

An example of the data read-out from the memory cell MC is as follows. First, the memory cell MC is selected. For example, the read-out circuit 622b supplies, to the MTJ element, a read-out current that flows in the direction from the selection transistor TR toward the MTJ element. Then, the read-out circuit 622b senses the resistance value of the MTJ element based on the read-out current. Thus, the information that is stored in the MTJ element can be read.

Figure 18:
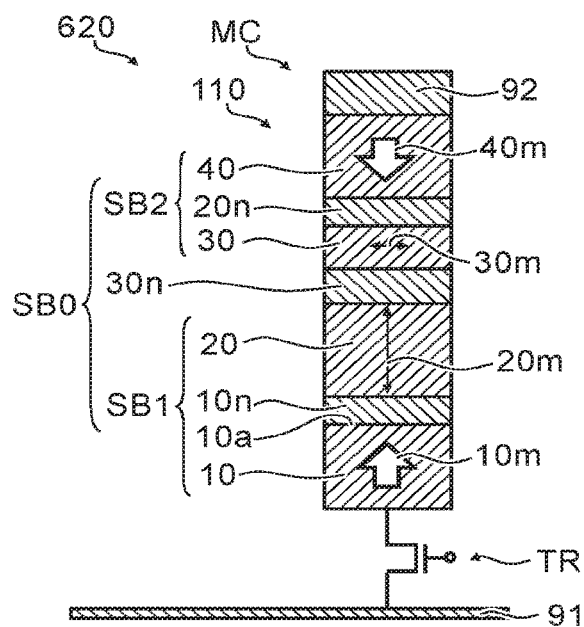
FIG. 18 is a schematic view showing the memory device according to the second embodiment.

FIG. 18 is a schematic view illustrating the memory device according to the second embodiment.

FIG. 18 shows a portion of one memory cell MC. Although the magnetic memory element 110 is used in the example, any magnetic memory element according to the embodiment may be used.

As shown in FIG. 18, the memory device 620 includes the magnetic memory element (e.g., the magnetic memory element 110) according to the embodiment, the first interconnect 91, and the second interconnect 92. The first interconnect 91 is connected directly or indirectly to one end of the magnetic memory element 110 (e.g., an end of the first stacked member SB1). The second interconnect 92 is connected directly or indirectly to the other end of the magnetic memory element 110 (e.g., an end of the second stacked member SB2).

Here, being "connected directly" includes the state of being electrically connected without another conductive member (e.g., a via electrode, an interconnect, etc.) inserted therebetween. Being "connected indirectly" includes the state of being electrically connected with another conductive member (e.g., a via electrode, an interconnect, etc.) inserted therebetween, and the state of being connected in a state in which a switch (e.g., a transistor or the like) is inserted therebetween and the conduction and non-conduction are changeable.

For example, one of the first interconnect 91 or the second interconnect 92 corresponds to the bit line BL. For example, the other one of the first interconnect 91 or the second interconnect 92 corresponds to the bit line /BL.

As shown in FIG. 18, the memory device 620 may further include the selection transistor TR. The selection transistor TR is provided between the magnetic memory element 110 and the first interconnect 91 (at a first position) and/or between the magnetic memory element 110 and the second interconnect 92 (at a second position).

By such a configuration, the data can be programmed to any memory cell MC (e.g., any magnetic memory element 110) of the memory cell array MCA; and the data that is programmed to the magnetic memory element 110 can be read. In the memory device 620 thus configured as well, the programming current can be reduced by providing the second ferromagnetic layer 20 and the third ferromagnetic layer 30 with magnetostatic coupling. Thereby, the failures due to dielectric breakdown can be suppressed; and the reliability increases.

According to the embodiments, a magnetic memory element and a memory device that have high reliability are provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the memory device such as the magnetic memory element, the first to fourth ferromagnetic layer, the first to third nonmagnetic layer, the intermediate interconnect, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all magnetic memory elements and memory devices practicable by an appropriate design modification by one skilled in the art based on the magnetic memory elements and memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

What is claimed is:

1. A memory device, comprising:
a magnetic memory element: and a controller electrically connected to the magnetic memory element, wherein the magnetic memory element comprises:
a stacked structure, comprising:
a first stacked member, comprising:
a first ferromagnetic layer,
a second ferromagnetic layer, and
a first nonmagnetic layer provided between the first ferromagnetic layer and the second ferromagnetic layer,
a magnetic resonance frequency of the second ferromagnetic layer being a first frequency, a direction of a magnetization of the second ferromagnetic layer being settable to a direction corresponding to an orientation of a first current when a magnetic field of the first frequency is applied to the first stacked member and the first current flows in the first stacked member along a first direction connecting the first ferromagnetic layer and the second ferromagnetic layer, the direction of the magnetization of the second ferromagnetic layer not changing to a direction corresponding to an orientation of a second current smaller than the first current when the second current flows in the first stacked member, and
a second stacked member stacked with the first stacked member along the first direction, the second stacked member including a third ferromagnetic layer, a magnetization of the third ferromagnetic layer being able to generate a magnetic field of the first frequency by the second current flowing in the second stacked member along the first direction,
the direction of the magnetization of the second ferromagnetic layer being settable to a direction corresponding to an orientation of a current by causing the current to flow in the first stacked member and the second stacked member along the first direction to generate a magnetic field acting on the second ferromagnetic layer, the controller causing a larger current to flow in the second stacked member than in the first stacked member in a programming operation of programming data to the magnetic memory element, and the controller causing a smaller current to flow in the second stacked member than in the first stacked member in a read-out operation of reading the data retained in the magnetic memory element.

2. The memory device according to claim 1, wherein the third ferromagnetic layer comprises a Heusler alloy comprising at least one selected from the group consisting of Co, Mn, Fe, Ni, Cu, Rh, Ru, and Pd.

3. The memory device according to claim 1, wherein the third ferromagnetic layer comprises at least one selected from the group consisting of $Co_2MnGa$, $Co_2MnAl$, $Ni_2MnIn$, $Ni_2MnGa$, $Ni_2MnSn$, $Pd_2MnSb$, $Pd_2MnSn$, $Cu_2MnAl$, $Cu_2MnSn$, $Cu_2MnIn$, $Rh_2MnGe$, and $Rh_2MnPb$.

4. The memory device according to claim 1, wherein the third ferromagnetic layer comprises at least one selected from a group consisting of $Co_2FeSi$, $Co_2FeAl$, $Co_2FeGa$, $Co_2MnGe$, $Co_2MnSn$, and $Co_2MnSi$.

5. The memory device according to claim 1, wherein a cross-sectional area of the first stacked member when cut by a plane perpendicular to the first direction is greater than a cross-sectional area of the second stacked member when cut by a plane perpendicular to the first direction.

6. The memory device according to claim 1, wherein the second ferromagnetic layer includes:
a first portion; and
a second portion stacked with the first portion in the first direction,
a magnetic resonance frequency of the second portion is lower than a magnetic resonance frequency of the first portion, and
directions of magnetizations of the first portion and the second portion can be set to a direction corresponding to the orientation of the current flowing in the second stacked member by the current flowing in the second stacked member.

7. The device according to claim 1, wherein
the second stacked member further comprises:
a fourth ferromagnetic layer stacked with the third ferromagnetic layer in the first direction; and
a second nonmagnetic layer provided between the third ferromagnetic layer and the fourth ferromagnetic layer.

8. The memory device according to claim 7, wherein an orientation of a first-direction component of the magnetization of the first ferromagnetic layer is reverse of an orientation of the first-direction component of a magnetization of the fourth ferromagnetic layer.

9. The memory device according to claim 1, wherein
a perpendicular magnetization component parallel to the first direction of a magnetization of the first ferromagnetic layer is larger than an in-plane magnetization component perpendicular to the first direction of the magnetization of the first ferromagnetic layer,
the perpendicular magnetization component of the magnetization of the second ferromagnetic layer is larger than the in-plane magnetization component of the magnetization of the second ferromagnetic layer, and
the perpendicular magnetization component of the magnetization of the third ferromagnetic layer is smaller than the in-plane magnetization component of the magnetization of the third ferromagnetic layer.

10. The memory device according to claim 1, wherein the stacked structure further comprises a magnetic shield facing at least a portion of a side surface of the stacked structure.

11. A memory device, comprising:
a magnetic memory element: and
a controller electrically connected to the magnetic memory element,
wherein the magnetic memory element comprises:
a stacked structure, comprising:
a first stacked member, comprising:
a first ferromagnetic layer,
a second ferromagnetic layer, and
a first nonmagnetic layer provided between the first ferromagnetic layer and the second ferromagnetic layer,
a magnetic resonance frequency of the second ferromagnetic layer being a first frequency, a direction of a magnetization of the second ferromagnetic layer being settable to a direction corresponding to an orientation of a first current when a magnetic field of the first frequency is applied to the first stacked member and the first current flows in the first stacked member along a first direction connecting the first ferromagnetic layer and the second ferromagnetic layer, the direction of the magnetization of the second ferromagnetic layer not changing to a direction corresponding to an orientation of a second current smaller than the first current when the second current flows in the first stacked member, and
a second stacked member stacked with the first stacked member along the first direction, the second stacked member including a third ferromagnetic layer, a magnetization of the third ferromagnetic layer being able to generate a magnetic field of the first frequency by the second current flowing in the second stacked member along the first direction,
the direction of the magnetization of the second ferromagnetic layer being settable to a direction corresponding to an orientation of a current by causing the current to flow in the first stacked member and the second stacked member along the first direction to generate a magnetic field acting on the second ferromagnetic layer,
the controller causing a current to flow in the second stacked member without causing a current to flow in the first stacked member in a programming operation of programming data to the magnetic memory element, and
the controller causing a current to flow in the first stacked member without causing a current to flow in the second stacked member in a read-out operation of reading the data retained in the magnetic memory element.

12. A memory device, comprising:
a magnetic memory element; and
a controller electrically connected to the magnetic memory element,
wherein the magnetic memory element comprises:
a stacked structure, comprising:
a first stacked member, comprising:
a first ferromagnetic layer,
a second ferromagnetic layer. and
a first nonmagnetic layer provided between the first ferromagnetic layer and the second ferromagnetic layer, a magnetic resonance frequency of the second ferromagnetic layer being a first frequency, a direction of a magnetization of the second ferromagnetic layer being settable to a direction corresponding to an orientation of a first current when a magnetic field of the first frequency is applied to the first stacked member and the first current flows in the first stacked member along a first direction connecting the first ferromagnetic layer and the second ferromagnetic layer, the direction of the magnetization of the second ferromagnetic layer not changing to a direction corresponding to an orientation of a second current smaller than the first current when the second current flows in the first stacked member, and a second stacked member stacked with the first stacked member along the first direction, the second stacked member including a third ferromagnetic layer, a magnetization of the third ferromagnetic layer being able to generate a magnetic field of the first frequency by the second current flowing in the second stacked member along the first direction, the direction of the magnetization of the second ferromagnetic layer being settable to a direction corresponding to an orientation of a current by causing the current to flow in the first stacked member and the second stacked member along the first direction to generate a magnetic field acting on the second ferromagnetic layer, the controller causing a larger current to flow in the second stacked member than in the first stacked member in a programming operation of programming data to the magnetic memory element, and the controller causing a larger current to flow in the second stacked member than in the first stacked member in a read-out operation of reading the data retained in the magnetic memory element.

13. A memory device, comprising:

a magnetic memory element; and a controller electrically connected to the magnetic memory element, wherein the magnetic memory element comprises:
a stacked structure, comprising
a first stacked member including
a first ferromagnetic layer,
a second ferromagnetic layer, and
a first nonmagnetic layer provided between the first ferromagnetic layer and the second ferromagnetic layer,
a magnetic resonance frequency of the second ferromagnetic layer being a first frequency, a direction of a magnetization of the second ferromagnetic layer being settable to a direction corresponding to an orientation of a first current when a magnetic field of the first frequency is applied to the first stacked member and the first current flows in the first stacked member along a first direction connecting the first ferromagnetic layer and the second ferromagnetic layer, the direction of the magnetization of the second ferromagnetic layer not changing to a direction corresponding to an orientation of a second current smaller than the first current when the second current flows in the first stacked member, and
a second stacked member stacked with the first stacked member along the first direction, the second stacked member including a third ferromagnetic layer, a magnetization of the third ferromagnetic layer being able to generate a magnetic field of the first frequency by the second current flowing in the second stacked member along the first direction.

the direction of the magnetization of the second ferromagnetic layer being settable to a direction corresponding to an orientation of a current by causing the current to flow in the first stacked member and the second stacked member along the first direction to generate a magnetic field acting on the second ferromagnetic layer.

the controller causing a current to flow in the second stacked member without causing a current to flow in the first stacked member in a programming operation of programming data to the magnetic memory element, and the controller causing a current to flow in the second stacked member without causing a current to flow in the first stacked member in a read-out operation of reading the data retained in the magnetic memory element.

* * * * *